(12) United States Patent
Kikuchi

(10) Patent No.: US 12,375,859 B2
(45) Date of Patent: *Jul. 29, 2025

(54) POLYMER-BASED PIEZOELECTRIC COMPOSITE MATERIAL, PIEZOELECTRIC FILM, PIEZOELECTRIC SPEAKER, AND FLEXIBLE DISPLAY

(71) Applicant: FUJIFILM Corporation, Tokyo (JP)

(72) Inventor: Wataru Kikuchi, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 901 days.

This patent is subject to a terminal disclaimer.

(21) Appl. No.: 17/547,267

(22) Filed: Dec. 10, 2021

(65) Prior Publication Data

US 2022/0102619 A1    Mar. 31, 2022

Related U.S. Application Data

(63) Continuation of application No. PCT/JP2020/022029, filed on Jun. 4, 2020.

(30) Foreign Application Priority Data

Jun. 28, 2019   (JP) .................................. 2019-122141

(51) Int. Cl.
   *H04R 17/00*  (2006.01)
   *C08F 20/34*  (2006.01)
   (Continued)

(52) U.S. Cl.
   CPC ........... *H04R 17/005* (2013.01); *C08F 20/34* (2013.01); *C08F 120/34* (2013.01); *C08K 3/11* (2018.01);
   (Continued)

(58) Field of Classification Search
   CPC .. H10N 30/852; H10N 30/883; H10N 30/092; H10N 30/2047; H10N 30/045; H04R 17/005

See application file for complete search history.

(56) References Cited

U.S. PATENT DOCUMENTS 9,761,784 B2   9/2017  Miyoshi
11,793,078 B2 * 10/2023  Miyoshi ............... H10N 30/852
                                                     381/190
(Continued)

FOREIGN PATENT DOCUMENTS

EP    3556782       10/2019
JP    2014014063    1/2014
(Continued)

OTHER PUBLICATIONS

"Office Action of Taiwan Counterpart Application", issued on Dec. 5, 2023, with English translation thereof, p. 1-p. 10.

(Continued)

*Primary Examiner* — J. San Martin
(74) *Attorney, Agent, or Firm* — JCIPRNET

(57) ABSTRACT

The present invention provides a polymer-based piezoelectric composite material from which a piezoelectric film capable of outputting a higher sound pressure and exhibiting excellent flexibility even in a low-temperature environment is obtained in a case of using a piezoelectric speaker, a piezoelectric film formed of the polymer-based piezoelectric composite material, and a piezoelectric speaker and a flexible display which are formed of the piezoelectric film. The polymer-based piezoelectric composite material of the present invention is a polymer-based piezoelectric composite (Continued)

material including a polymer matrix which contains a polymer containing a group represented by Formula (1), and piezoelectric particles.

$$*-L^1-(CR^1R^2)_n-CN \quad \text{Formula (1)}$$

In Formula (1), $L^1$ represents a divalent linking group excluding a urethane group. $R^1$ and $R^2$ each independently represent a hydrogen atom, an alkyl group, or an aryl group. n represents an integer of 3 or greater. * represents a bonding position with respect to the main chain of a polymer.

10 Claims, 3 Drawing Sheets

(51) Int. Cl.

| | |
|---|---|
| *C08F 120/34* | (2006.01) |
| *C08K 3/11* | (2018.01) |
| *G02F 1/1333* | (2006.01) |
| *G02F 1/167* | (2019.01) |
| *G02F 1/16755* | (2019.01) |
| *H10K 59/00* | (2023.01) |
| *H10K 77/10* | (2023.01) |
| *H10N 30/092* | (2023.01) |
| *H10N 30/85* | (2023.01) |
| *H10K 102/00* | (2023.01) |

(52) U.S. Cl.
CPC ........ *G02F 1/133305* (2013.01); *G02F 1/167* (2013.01); *G02F 1/16755* (2019.01); *H10K 59/00* (2023.02); *H10K 77/111* (2023.02); *H10N 30/092* (2023.02); *H10N 30/852* (2023.02); *H10K 2102/311* (2023.02)

(56) References Cited

U.S. PATENT DOCUMENTS

| | | | |
|---|---|---|---|
| 12,069,429 B2* | 8/2024 | Fujikata | H10N 30/883 |
| 2013/0256581 A1* | 10/2013 | Miyoshi | C08K 3/08 |
| | | | 427/535 |
| 2014/0210309 A1* | 7/2014 | Miyoshi | G10H 3/146 |
| | | | 310/313 A |
| 2018/0160248 A1 | 6/2018 | Murakami et al. | |
| 2021/0392453 A1 | 12/2021 | Murakami et al. | |
| 2022/0115581 A1* | 4/2022 | Kikuchi | G06F 1/1652 |
| 2023/0363284 A1* | 11/2023 | Kagawa | H10N 30/852 |
| 2023/0421964 A1* | 12/2023 | Tamada | H10N 30/50 |
| 2024/0032431 A1* | 1/2024 | Iwamoto | H10N 30/50 |

FOREIGN PATENT DOCUMENTS

| | | |
|---|---|---|
| JP | 2018059042 | 4/2018 |
| WO | 2017018313 | 2/2017 |
| WO | 2018061393 | 4/2018 |
| WO | 2018135457 | 7/2018 |

OTHER PUBLICATIONS

"International Search Report (Form PCT/ISA/210) of PCT/JP2020/022029," mailed on Aug. 18, 2020, with English translation thereof, pp. 1-5.

"Written Opinion of the International Searching Authority (Form PCT/ISA/237)" of PCT/JP2020/022029, mailed on Aug. 18, 2020, with English translation thereof, pp. 1-6.

* cited by examiner

POLYMER-BASED PIEZOELECTRIC COMPOSITE MATERIAL, PIEZOELECTRIC FILM, PIEZOELECTRIC SPEAKER, AND FLEXIBLE DISPLAY

CROSS-REFERENCE TO RELATED APPLICATIONS

This application is a Continuation of PCT International Application No. PCT/JP2020/022029 filed on Jun. 4, 2020, which claims priority under 35 U.S.C. § 119(a) to Japanese Patent Application No. 2019-122141 filed on Jun. 28, 2019. The above application is hereby expressly incorporated by reference, in its entirety, into the present application.

BACKGROUND OF THE INVENTION

1. Field of the Invention

The present invention relates to a polymer-based piezoelectric composite material, a piezoelectric film formed of the polymer-based piezoelectric composite material, a piezoelectric speaker formed of the piezoelectric film, and a flexible display.

2. Description of the Related Art

With reduction in thickness and weight of displays such as liquid crystal displays or organic electroluminescence (EL) displays, speakers used in these thin displays are also required to be lighter and thinner. Further, with the development of flexible displays formed of flexible substrates such as plastics, speakers used in the flexible displays are also required to be flexible.

Examples of typical shapes of speakers of the related art include a funnel-like so-called cone shape and a spherical dome shape. However, in a case where such a speaker is intended to be incorporated in the above-described thin display, there is a concern that the lightness and the flexibility of the speaker are impaired because the speaker cannot be sufficiently made thin. Further, in a case where the speaker is attached externally, it is troublesome to carry the speaker.

Therefore, as a speaker that is thin and can be integrated into a thin display or a flexible display without impairing lightness and flexibility, a sheet-like piezoelectric film having flexibility and a property of stretching and contracting in response to an applied voltage has been suggested.

For example, a piezoelectric film (electroacoustic conversion film) disclosed in JP2014-014063A has been suggested as a sheet-like piezoelectric film that has flexibility and can stably reproduce a high-quality sound. For example, the piezoelectric film disclosed in JP2014-014063A includes a polymer-based piezoelectric composite material (piezoelectric layer) obtained by dispersing piezoelectric particles in a viscoelastic matrix consisting of a polymer material having a viscoelasticity at room temperature, a thin film electrode formed on each of both surfaces of the polymer-based piezoelectric composite material, and a protective layer formed on a surface of the thin film electrode.

SUMMARY OF THE INVENTION

In such a piezoelectric film, further improvement in sound pressure is desired in recent years.

As a result of examination on characteristics of the sound pressure of a piezoelectric speaker formed of the piezoelectric film described in JP2014-014063A, the present inventors found that the current requirement level has not been satisfied and thus further improvement is necessary.

Further, in a case where the piezoelectric film is used for various applications, the piezoelectric film may be used in a low-temperature environment. Therefore, the piezoelectric film is required to exhibit excellent flexibility even in a low-temperature environment.

The present invention has been made to solve such problems of the related art, and an object thereof is to provide a polymer-based piezoelectric composite material from which a piezoelectric film capable of outputting a higher sound pressure and exhibiting excellent flexibility even in a low-temperature environment is obtained in a case of using a piezoelectric speaker, a piezoelectric film formed of the polymer-based piezoelectric composite material, and a piezoelectric speaker and a flexible display which are formed of the piezoelectric film.

In order to solve the above-described problem, the present invention has the following configurations.

[1] A polymer-based piezoelectric composite material comprising: a polymer matrix which contains a polymer containing a group represented by Formula (1); and piezoelectric particles.

[2] The polymer-based piezoelectric composite material according to [1], in which the polymer has a repeating unit represented by Formula (2).

[3] The polymer-based piezoelectric composite material according to [2], in which $L^1$ represents —O—, —S—, —CO—, —NH—, or a group formed by combining two or more thereof, where a urethane group is excluded.

[4] The polymer-based piezoelectric composite material according to [2] or [3], in which the polymer is a polymer having only a repeating unit represented by Formula (2) in which n represents an integer of 3 to 5 or a polymer having a repeating unit represented by Formula (2) and a repeating unit containing a polar group other than a cyano group.

[5] The polymer-based piezoelectric composite material according to any one of [1] to [4], in which a content of the piezoelectric particles is 50% by volume or greater with respect to a total volume of the polymer-based piezoelectric composite material.

[6] The polymer-based piezoelectric composite material according to any one of [1] to [5], in which the piezoelectric particles include ceramic particles having a perovskite-type or wurtzite-type crystal structure.

[7] The polymer-based piezoelectric composite material according to [6], in which the piezoelectric particles contain any of lead zirconate titanate, lead lanthanum zirconate titanate, barium titanate, zinc oxide, or a solid solution of barium titanate and bismuth ferrite.

[8] A piezoelectric film comprising: the polymer-based piezoelectric composite material according to any one of [1] to [7]; and two thin film electrodes laminated on both surfaces of the polymer-based piezoelectric composite material.

[9] A piezoelectric speaker comprising: the piezoelectric film according to [8].

[10] A flexible display comprising: the piezoelectric film according to [8] that is attached to a surface of a flexible display having flexibility on a side opposite to an image display surface.

According to the present invention, it is possible to provide a polymer-based piezoelectric composite material from which a piezoelectric film capable of outputting a higher sound pressure and exhibiting excellent flexibility even in a low-temperature environment is obtained in a case of using a piezoelectric speaker, a piezoelectric film formed of the polymer-based piezoelectric composite material, and a piezoelectric speaker and a flexible display which are formed of the piezoelectric film.

DESCRIPTION OF THE PREFERRED EMBODIMENTS

Figure 1:
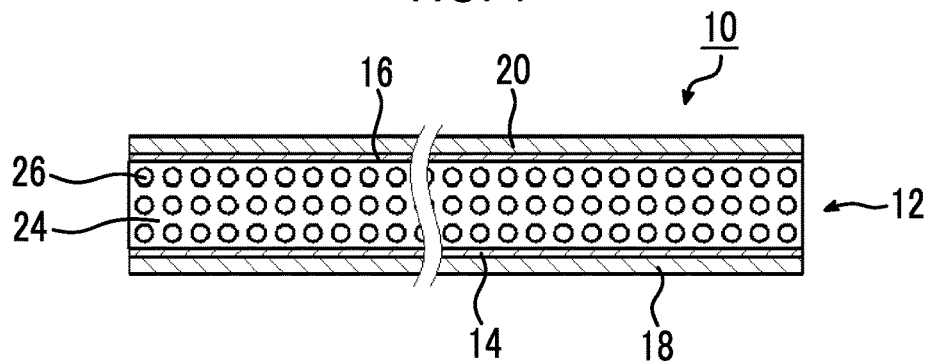
FIG. 1 is a cross-sectional view conceptually illustrating an example of the piezoelectric film according to the embodiment of the present invention.

Hereinafter, a polymer-based piezoelectric composite material, a piezoelectric film, a piezoelectric speaker, a flexible display, a vocal cord microphone, and a sensor for a musical instrument of the present invention will be described in detail based on preferred embodiments illustrated in the accompanying drawings.

Descriptions of the constituent requirements described below may be made based on representative embodiments of the present invention, but the present invention is not limited to such embodiments.

In the present specification, a numerical range shown using "to" indicates a range including numerical values described before and after "to" as a lower limit and an upper limit.

Further, a bonding direction of a divalent group described in the present specification is not limited unless otherwise specified. For example, in a case where Y in a compound represented by Formula "X—Y—Z" represents —COO—, Y may represent —CO—O— or —O—CO—. That is, the compound may be represented by Formula "X—CO—O—Z" or "X—O—CO—Z".

As an example, the polymer-based piezoelectric composite material according to the embodiment of the present invention is molded into a sheet shape, provided with thin film electrodes (electrode layers) on both surfaces thereof, and used as a piezoelectric film. Such a piezoelectric film is used, for example, as a vibration plate of an electroacoustic converter such as a piezoelectric speaker, a microphone, or a voice sensor.

In an electroacoustic converter, in a case where the piezoelectric film is stretched in the in-plane direction due to application of a voltage to the piezoelectric film, the piezoelectric film moves upward (in the radiation direction of the sound) in order to absorb the stretched part. On the contrary, in a case where the piezoelectric film is contracted in the in-plane direction due to application of a voltage to the piezoelectric film, the piezoelectric film moves downward in order to absorb the contracted part.

The electro acoustic converter converts vibration (sound) and an electric signal using vibration caused by repeated stretch and contraction of the piezoelectric film and is used to input an electric signal to the piezoelectric film to reproduce a sound due to the vibration in response to the electric signal, convert the vibration of the piezoelectric film to an electric signal by receiving a sound wave, and apply tactile sensation or transport an object through the vibration.

Specific examples of the electroacoustic converter include various acoustic devices such as pickups (sensors for musical instruments) used for musical instruments such as guitars, speakers (for example, full-range speakers, tweeters, squawkers, and woofers), speakers for headphones, noise cancellers, and microphones. Further, the piezoelectric film according to the embodiment of the present invention is a non-magnetic material, and thus can be suitably used as a noise canceller for MRI (magnetic resonance imaging) among noise cancellers.

Further, the electroacoustic converter formed of the piezoelectric film according to the embodiment of the present invention is thin, light, and bendable, and thus can be suitably used as wearable products such as hats, mufflers, and clothes, thin displays such as televisions and digital signage, buildings having a function as an acoustic device, ceilings of automobiles, curtains, umbrellas, wallpaper, windows, beds, and the like.

FIG. 1 is a cross-sectional view conceptually illustrating an example of the piezoelectric film according to the embodiment of the present invention.

As illustrated in FIG. 1, a piezoelectric film 10 according to the embodiment of the present invention includes a piezoelectric layer 12 which is a sheet-like material having piezoelectric properties, a lower thin film electrode 14 laminated on one surface of the piezoelectric layer 12, a lower protective layer 18 laminated on the lower thin film electrode 14, an upper thin film electrode 16 laminated on the other surface of the piezoelectric layer 12, and an upper protective layer 20 laminated on the upper thin film electrode 16.

In the piezoelectric film 10, the piezoelectric layer 12 which is a polymer-based piezoelectric composite material consists of a polymer-based piezoelectric composite material obtained by dispersing piezoelectric particles 26 in a polymer matrix 24 consisting of a polymer material as conceptually illustrated in FIG. 1.

The piezoelectric layer 12 is the polymer-based piezoelectric composite material according to the embodiment of the present invention.

Here, it is preferable that the polymer-based piezoelectric composite material (piezoelectric layer 12) satisfies the following requirements. Further, in the present invention, room temperature is in a range of 0° C. to 50° C.

(i) Flexibility

For example, in a case of being gripped in a state of being loosely bent like a document such as a newspaper or a magazine as a portable device, the piezoelectric film is continuously subjected to large bending deformation from the outside at a relatively slow vibration of less than or equal to a few Hz. In this case, in a case where the polymer-based piezoelectric composite material is hard, a large bending stress is generated to that extent, and a crack is generated at the interface between a polymer matrix and piezoelectric particles, which may lead to breakage. Accordingly, the polymer-based piezoelectric composite material is required to have suitable flexibility. In addition, in a case where strain energy is diffused into the outside as heat, the stress can be relieved. Therefore, the polymer-based piezoelectric composite material is required to have a suitably large loss tangent.

(ii) Acoustic Quality

In a speaker, the piezoelectric particles vibrate at a frequency of an audio band of 20 Hz to 20 kHz, and the vibration energy causes the entire vibration plate (polymer-based piezoelectric composite material) to vibrate integrally so that a sound is reproduced. Therefore, in order to increase the transmission efficiency of the vibration energy, the polymer-based piezoelectric composite material is required to have appropriate hardness. In addition, in a case where the frequencies of the speaker are smooth as the frequency characteristic thereof, an amount of change in acoustic quality in a case where the lowest resonance frequency $f_0$ is changed in association with a change in the curvature of the speaker decreases. Therefore, the loss tangent of the polymer-based piezoelectric composite material is required to be suitably large.

It is known that the lowest resonance frequency $f_0$ of the vibration plate for a speaker is represented by the following equation. Here, s represents the stiffness of the vibration system and m represents the mass.

$$\text{Lowest resonance frequency: } f_0 = \frac{1}{2\pi}\sqrt{\frac{s}{m}}$$

Here, as the degree of curvature of the piezoelectric film (that is, the radius of curvature of the curved portion increases), the mechanical stiffness s decreases, and thus the lowest resonance frequency $f_0$ decreases. That is, the acoustic quality (the volume and the frequency characteristics) of the speaker changes depending on the radius of curvature of the piezoelectric film.

That is, the polymer-based piezoelectric composite material is required to exhibit a behavior of being rigid with respect to a vibration of 20 Hz to 20 kHz and being flexible with respect to a vibration of less than or equal to a few Hz. In addition, the loss tangent of the polymer-based piezoelectric composite material is required to be suitably large with respect to the vibration of all frequencies of 20 kHz or less.

In general, a polymer solid has a viscoelasticity relieving mechanism, and a molecular movement having a large scale is observed as a decrease (relief) in a storage elastic modulus (Young's modulus) or a maximal value (absorption) in a loss elastic modulus along with an increase in temperature or a decrease in frequency. Among these, the relief due to a microbrown movement of a molecular chain in an amorphous region is referred to as main dispersion, and an extremely large relieving phenomenon is observed. A temperature at which this main dispersion occurs is a glass transition point (Tg), and the viscoelasticity relieving mechanism is most remarkably observed.

In the polymer-based piezoelectric composite material (piezoelectric layer 12), the polymer-based piezoelectric composite material exhibiting a behavior of being rigid with respect to a vibration of 20 Hz to 20 kHz and being flexible with respect to a vibration of less than or equal to a few Hz is realized by using a polymer material whose glass transition point is room temperature (that is, a polymer material having a viscoelasticity at room temperature as a matrix). In particular, from the viewpoint that such a behavior is suitably exhibited, it is preferable that the polymer material in which the glass transition temperature at a frequency of 1 Hz is at room temperature is used for a matrix of the polymer-based piezoelectric composite material.

In the polymer material constituting the polymer matrix, it is preferable that the maximal value of a loss tan δ at a frequency of 1 Hz according to a dynamic viscoelasticity test at room temperature is 0.5 or greater.

In this manner, in a case where the polymer-based piezoelectric composite material is slowly bent due to an external force, stress concentration on the interface between the polymer matrix and the piezoelectric particles at the maximum bending moment portion is relieved, and thus satisfactory flexibility can be expected.

In the polymer material constituting the polymer matrix, it is preferable that a storage elastic modulus (E') at a frequency of 1 Hz according to the dynamic viscoelasticity measurement is 100 MPa or greater at 0° C. and 10 MPa or less at 50° C.

In this manner, the bending moment generated in a case where the polymer-based piezoelectric composite material is slowly bent due to the external force can be reduced, and the polymer-based piezoelectric composite material can exhibit a behavior of being rigid with respect to an acoustic vibration of 20 Hz to 20 kHz.

In addition, it is more suitable that the relative dielectric constant of the polymer material constituting the polymer matrix is 10 or greater at 25° C. Accordingly, in a case where a voltage is applied to the polymer-based piezoelectric composite material, a higher electric field is applied to the piezoelectric particles in the polymer matrix, and thus a large deformation amount can be expected.

However, in consideration of ensuring satisfactory moisture resistance and the like, it is suitable that the relative dielectric constant of the polymer material is 10 or less at 25° C.

In the polymer-based piezoelectric composite material (piezoelectric layer 12) according to the embodiment of the present invention, a polymer (hereinafter, also simply referred to as a "specific polymer") containing a group represented by Formula (1) is used as the polymer material constituting the polymer matrix 24 suitably satisfying these conditions. In Formula (1), * represents a bonding position.

$$\text{*-L}^1\text{-(CR}^1\text{R}^2)_n\text{—CN} \qquad \text{Formula (1)}$$

In Formula (1), $L^1$ represents a divalent linking group excluding a urethane group. That is, $L^1$ represents a divalent linking group that does not contain a urethane group.

Further, the urethane group is a group represented by —NH—CO—O—.

Examples of the divalent linking group excluding a urethane group include —O—, —CO—, —S—, —SO$_2$—, —NR$^a$— (R$^a$ represents a hydrogen atom or an alkyl group), a divalent aliphatic hydrocarbon group, an arylene group, and a group formed by combining two or more thereof (for example, —COO— or —CONH—). However, the group formed by combining two or more thereof does not include a urethane group.

Among these, from the viewpoint that the effects of the present invention are more excellent, $L^1$ represents preferably —O—, —S—, —CO—, —NH—, or a group formed by combining two or more thereof and more preferably —COO—. That is, it is preferable that the group represented by Formula (1) is —CO—O—$(CR^1R^2)_n$—CN or —O—CO— $(CR^1R^2)_n$—CN.

$R^1$ and $R^2$ each independently represent a hydrogen atom, an alkyl group, or an aryl group.

The number of carbon atoms of the alkyl group represented by $R^1$ and $R^2$ is not particularly limited, but is preferably in a range of 1 to 5 and more preferably in a range of 1 to 3 from the viewpoint that the effects of the present invention are more excellent.

The aryl group represented by $R^1$ and $R^2$ may be monocyclic or polycyclic, and examples thereof include a phenyl group.

n represents an integer of 3 or greater. In many cases, n represents an integer of 3 to 10, and from the viewpoint that the effects of the present invention are more excellent, it is preferable that n represents an integer of 3 to 5.

\* represents a bonding position with respect to the main chain of a polymer. That is, the group represented by Formula (1) is directly bonded to the main chain of a polymer.

The polymer skeleton of the main chain of the polymer to be bonded to the group represented by Formula (1) in the specific polymer is not particularly limited, and examples thereof include a polyacrylate skeleton, a polymethacrylate skeleton, a polyacrylamide skeleton, a polymethacrylamide skeleton, a polyester skeleton, a polyurethane skeleton, a polyurea skeleton, a polyamide skeleton, a polycarbonate skeleton, a polyolefin skeleton, a polyether skeleton, a polyvinyl ether skeleton, and a polystyrene skeleton.

Among these, from the viewpoint that the effects of the present invention are more excellent, it is preferable that the specific polymer has a repeating unit represented by Formula (2). The repeating unit represented by Formula (2) corresponds to an aspect in which a group represented by Formula (1) is bonded to the main chain of a polymer.

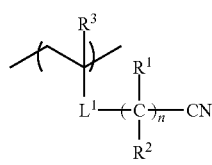

(2)

$L^1$, $R^1$, $R^2$, and n in Formula (2) each have the same definition as that for $L^1$, $R^1$, $R^2$, and n in Formula (1).

$R^3$ represents a hydrogen atom or an alkyl group.

The number of carbon atoms of the alkyl group represented by $R^3$ is not particularly limited, but is preferably in a range of 1 to 5 and more preferably in a range of 1 to 3.

Among these, from the viewpoint that the effects of the present invention are more excellent, a repeating unit represented by Formula (2-1) or a repeating unit represented by Formula (2-2) is preferable as the repeating unit represented by Formula (2).

The definition of each group in Formula (2-1) and Formula (2-2) is as described above.

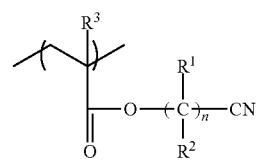

(2-1)

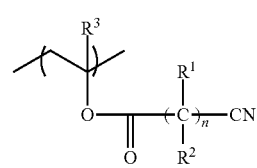

(2-2)

The content of the repeating unit represented by Formula (2) in the specific polymer is not particularly limited, but is preferably 50% by mole or greater, more preferably 80% by mole or greater, and still more preferably 90% by mole or greater with respect to all repeating units in the specific polymer from the viewpoint that the effects of the present invention are more excellent. The upper limit thereof is, for example, 100% by mass.

The repeating unit represented by Formula (2) may be used alone or in combination of two or more kinds thereof. In a case where the specific polymer has two or more repeating units represented by Formula (2), it is preferable that the total amount thereof is in the above-described range.

The specific polymer may have repeating units other than the repeating unit represented by Formula (2).

As other repeating unit, a repeating unit containing a cyano group (CN) or a repeating unit containing no cyano group may be used.

From the viewpoint that the effects of the present invention are more excellent, a repeating unit containing a polar group other than a cyano group is preferable as other repeating units. Examples of the polar group include a hydroxyl group, a carboxyl group, and an amino group.

As the repeating unit containing a polar group other than a cyano group, a repeating unit represented by Formula (3) is preferable.

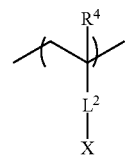

(3)

In Formula (3), $R^4$ represents a hydrogen atom or an alkyl group.

The number of carbon atoms of the alkyl group represented by $R^4$ is not particularly limited, but is preferably in a range of 1 to 5 and more preferably in a range of 1 to 3 from the viewpoint that the effects of the present invention are more excellent.

$L^2$ represents a single bond or a divalent linking group. Examples of the divalent linking group represented by $L^2$ include the groups exemplified as the divalent linking group represented by $L^1$ described above and a urethane group. As the divalent linking group represented by $L^2$, —O—, —CO—, a divalent aliphatic hydrocarbon group, or a group formed by combining two or more thereof (for example, —CO—O-alkylene group-) is preferable.

X represents a hydroxyl group, a carboxyl group, or an amino group.

Among these, from the viewpoint that the effects of the present invention are more excellent, examples of the repeating unit represented by Formula (3) include a repeating unit represented by Formula (3-1).

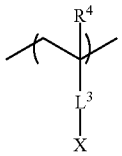

(3-1)

In Formula (3-1), $L^3$ represents a single bond or —CO—O-alkylene group-*1. Further, *1 represents a bonding position with respect to X.

The definitions of X and $R^4$ are as described above.

In a case where the specific polymer has a repeating unit represented by Formula (3), the content of the repeating unit represented by Formula (3) is not particularly limited, but is preferably in a range of 1% to 40% by mole and more preferably in a range of 5% to 25% by mole with respect to all repeating units in the specific polymer from the viewpoint that the effects of the present invention are more excellent.

The repeating unit represented by Formula (3) may be used alone or in combination of two or more kinds thereof. In a case where the specific polymer has two or more repeating units represented by Formula (3), it is preferable that the total amount thereof is in the above-described range.

Further, the specific polymer may have repeating units other than the repeating unit containing a polar group excluding a cyano group, and examples thereof include a repeating unit represented by Formula (4).

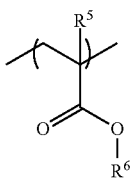

(4)

In Formula (4), $R^5$ represents a hydrogen atom or an alkyl group.

The number of carbon atoms of the alkyl group represented by $R^5$ is not particularly limited, but is preferably in a range of 1 to 5 and more preferably in a range of 1 to 3 from the viewpoint that the effects of the present invention are more excellent.

$R^6$ represents an alkyl group.

The number of carbon atoms of the alkyl group represented by $R^6$ is not particularly limited, but is preferably in a range of 1 to 20, more preferably in a range of 1 to 10, and still more preferably in a range of 1 to 5 from the viewpoint that the effects of the present invention are more excellent.

From the viewpoint that the effects of the present invention are more excellent, a polymer having only a repeating unit represented by Formula (2) in which n represents an integer of 3 to 5 or a polymer having a repeating unit represented by Formula (2) or a repeating unit containing a polar group other than a cyano group (preferably a repeating unit represented by Formula (3)) is preferable as the specific polymer.

Specific examples of the specific polymer are shown below.

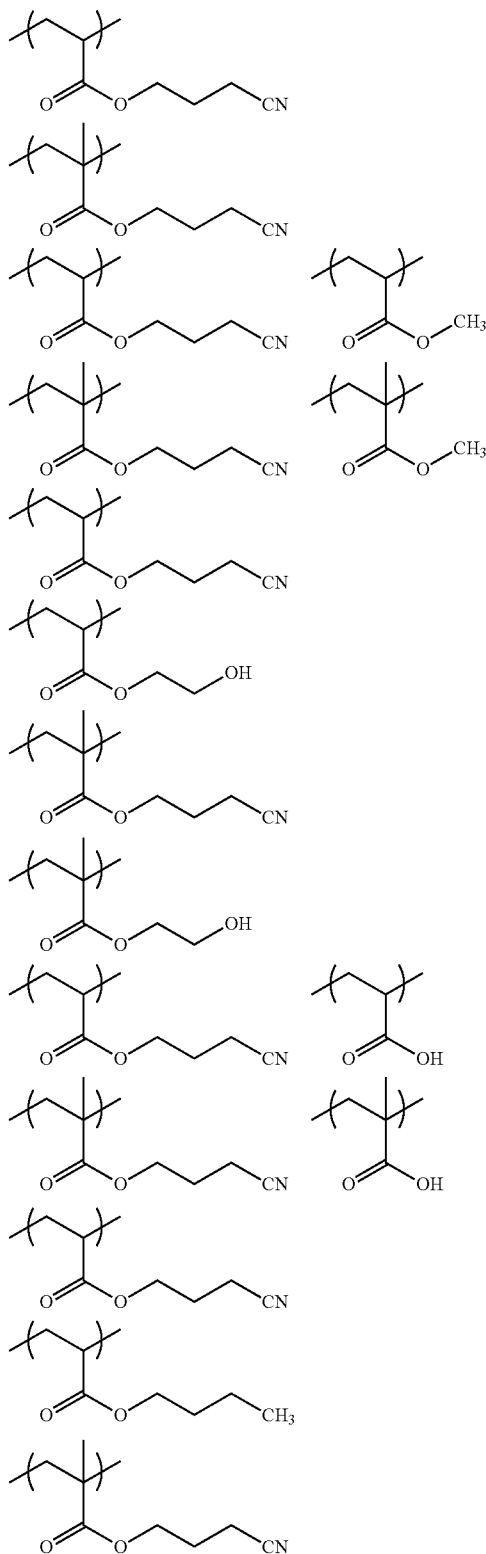

-continued

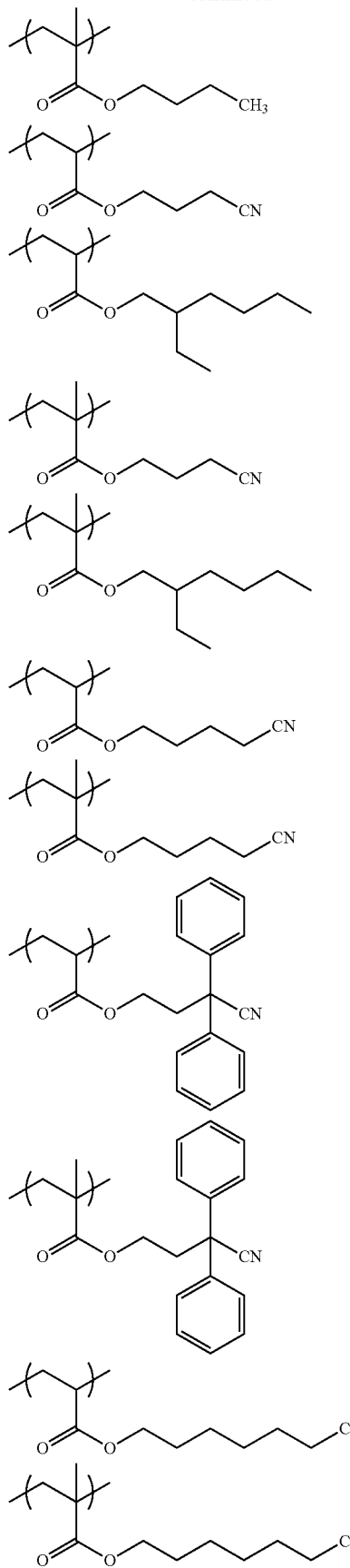

-continued

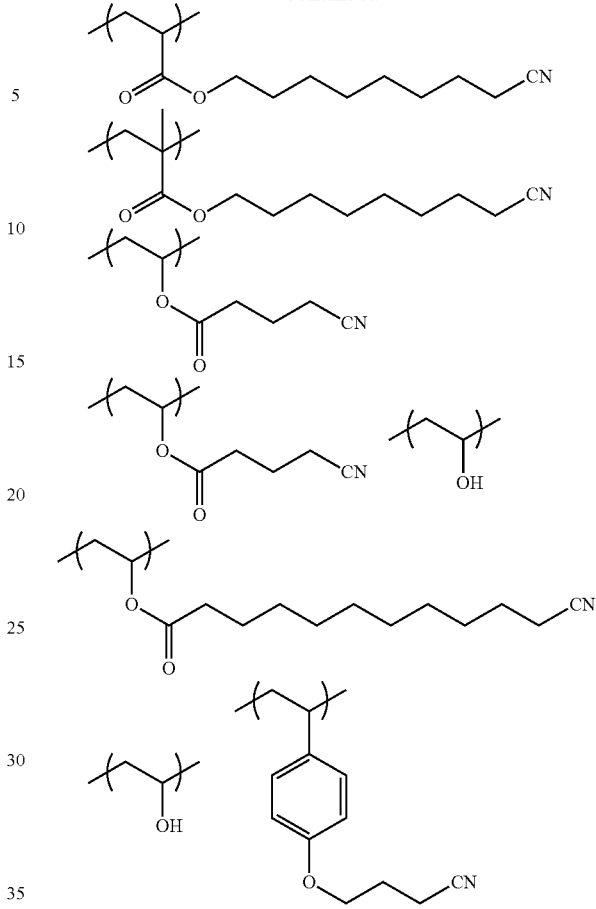

The weight-average molecular weight of the specific polymer is not particularly limited, but is preferably in a range of 5000 to 300000 and more preferably in a range of 8000 to 100000 from the viewpoint that the effects of the present invention are more excellent.

In the present specification, the weight-average molecular weight of a polymer is measured with the following device under the conditions described below.

Measuring device: trade name "LC-20AD" (manufactured by Shimadzu Corporation)

Columns: Shodex KF-801×2, KF-802, and KF-803 (manufactured by Showa Denko K. K.)

Measurement temperature: 40° C.

Eluent: tetrahydrofuran, sample concentration of 0.1% to 0.2% by mass

Flow rate: 1 mL/min

Detector: UV-VIS detector (trade name "SPD-20A", manufactured by Shimadzu Corporation)

Molecular weight: in terms of standard polystyrene

The specific polymer can be synthesized by a known method.

The polymer matrix 24 containing the specific polymer may contain a plurality of kinds of specific polymers as necessary.

Further, other dielectric polymers in addition to the above-described specific polymers may be added to the polymer matrix 24 constituting the polymer-based piezoelectric composite material according to the embodiment of the present invention as necessary for the purpose of adjusting the dielectric characteristics and mechanical characteristics.

Examples of the dielectric polymer material that can be added thereto include a fluorine-based polymer such as polyvinylidene fluoride, a vinylidene fluoride-tetrafluoroethylene copolymer, a vinylidene fluoride-trifluoroethylene copolymer, a polyvinylidene fluoride-trifluoroethylene copolymer, or a polyvinylidene fluoride-tetrafluoroethylene copolymer, a polymer containing a cyano group or a cyanoethyl group such as a vinylidene cyanide-vinyl acetate copolymer, cyanoethyl cellulose, cyanoethyl hydroxysaccharose, cyanoethyl hydroxycellulose, cyanoethyl hydroxypullulan, cyanoethyl methacrylate, cyanoethyl acrylate, cyanoethyl hydroxyethyl cellulose, cyanoethyl amylose, cyanoethyl hydroxypropyl cellulose, cyanoethyl dihydroxypropyl cellulose, cyanoethyl hydroxypropyl amylose, cyanoethyl polyacrylamide, cyanoethyl polyacrylate, cyanoethyl pullulan, cyanoethyl polyhydroxymethylene, cyanoethyl glycidol pullulan, cyanoethyl saccharose, or cyanoethyl sorbitol, and synthetic rubber such as nitrile rubber or chloroprene rubber.

Among these, a polymer material containing a cyanoethyl group is suitably used.

Further, in the polymer matrix 24 of the piezoelectric layer 12, the number of other dielectric polymers is not limited to one, and a plurality of kinds of dielectric polymers may be used.

In addition, for the purpose of adjusting the glass transition point Tg of the polymer matrix 24, the polymer matrix 24 may contain a thermoplastic resin such as a vinyl chloride resin, polyethylene, polystyrene, a methacrylic resin, polybutene, or isobutylene, and a thermosetting resin such as a phenol resin, a urea resin, a melamine resin, an alkyd resin, or mica in addition to the dielectric polymers.

Further, for the purpose of improving the pressure sensitive adhesiveness, the polymer matrix 24 may contain a viscosity imparting agent such as rosin ester, rosin, terpene, terpene phenol, or a petroleum resin.

In a case where the polymer matrix 24 of the piezoelectric layer 12 contains dielectric polymers other than the specific polymer described above, the content of other dielectric polymers is not limited, but is preferably 30% by mass or less in terms of the proportion thereof in the polymer matrix 24.

The piezoelectric layer 12 (polymer-based piezoelectric composite material) is obtained by dispersing the piezoelectric particles 26 in such a polymer matrix.

It is preferable that the piezoelectric particles 26 consist of ceramic particles having a perovskite type or wurtzite type crystal structure.

Examples of the material constituting the piezoelectric particles 26 include lead zirconate titanate (PZT), lead lanthanum zirconate titanate (PLZT), barium titanate (BaTiO$_3$), zinc oxide (ZnO), and a solid solution (BFBT) of barium titanate and bismuth ferrite (BiFe$_3$).

The particle diameter of the piezoelectric particles 26 may be appropriately selected according to the size and the applications of the piezoelectric film 10. The particle diameter of the piezoelectric particles 26 is preferably in a range of 1 to 10 μm.

By setting the particle diameter of the piezoelectric particles 26 to be in the above-described range, preferable results in terms of achieving both excellent piezoelectric characteristics and flexibility can be obtained.

In FIG. 1, the piezoelectric particles 26 in the piezoelectric layer 12 are uniformly dispersed in the polymer matrix 24 with regularity, but the present invention is not limited thereto.

That is, the piezoelectric particles 26 in the piezoelectric layer 12 may be irregularly dispersed in the polymer matrix 24 as long as the piezoelectric particles 26 are preferably uniformly dispersed therein.

In the piezoelectric film 10, the ratio between the amount of the polymer matrix 24 and the amount of the piezoelectric particles 26 in the piezoelectric layer 12 may be appropriately set according to the size and the thickness of the piezoelectric film 10 in the plane direction, the applications of the piezoelectric film 10, the characteristics required for the piezoelectric film 10, and the like.

The volume fraction of the piezoelectric particles 26 in the piezoelectric layer 12 is preferably 30% by volume or greater and more preferably 50% by volume or greater. The upper limit thereof is preferably 70% by volume or less.

By setting the ratio between the amount of the polymer matrix 24 and the amount of the piezoelectric particles 26 to be in the above-described range, preferable results in terms of achieving both of excellent piezoelectric characteristics and flexibility can be obtained.

In the piezoelectric film 10, the thickness of the piezoelectric layer 12 is not limited and may be appropriately set according to the size of the piezoelectric film 10, the applications of the piezoelectric film 10, the characteristics required for the piezoelectric film 10, and the like.

The thickness of the piezoelectric layer 12 is preferably in a range of 8 to 300 μm, more preferably in a range of 8 to 40 μm, still more preferably in a range of 10 to 35 μm, and even still more preferably in a range of 15 to 25 μm.

By setting the thickness of the piezoelectric layer 12 to be in the above-described range, preferable results in terms of achieving both ensuring of the rigidity and moderate elasticity can be obtained.

It is preferable that the piezoelectric layer 12 is subjected to a polarization treatment (poling) in the thickness direction. The polarization treatment will be described in detail later.

As illustrated in FIG. 1, the piezoelectric film 10 according to the embodiment of the present invention has a configuration in which the lower thin film electrode 14 is provided on one surface of the piezoelectric layer 12, the lower protective layer 18 is provided on the lower thin film electrode 14 as a preferred embodiment, the upper thin film electrode 16 is provided on the other surface of the piezoelectric layer 12, and the upper protective layer 20 is provided on the upper thin film electrode 16 as a preferred embodiment. In the piezoelectric film 10, the upper thin film electrode 16 and the lower thin film electrode 14 form an electrode pair.

That is, the piezoelectric film 10 according to the embodiment of the present invention has a configuration in which both surfaces of the piezoelectric layer 12 are sandwiched between the electrode pair, that is, the upper thin film electrode 16 and the lower thin film electrode 14 and preferably between the upper protective layer 20 and the lower protective layer 18.

In this manner, the region sandwiched between the upper thin film electrode 16 and the lower thin film electrode 14 is driven according to the applied voltage.

Further, the piezoelectric film 10 may further have, for example, a bonding layer for bonding the thin film electrode and the piezoelectric layer 12 to each other and a bonding layer for bonding the thin film electrode and the protective layer to each other, in addition to the above-described layers. A known bonding agent (an adhesives or a pressure sensitive adhesive) can be used as the bonding layer as long as the objects to be bonded can be bonded to each other. Further, the same material as the polymer material (that is, the polymer matrix 24) obtained by removing the piezoelectric particles 26 from the piezoelectric layer 12 can also be suitably used as the bonding agent. Further, the bonding layer may be provided on both the upper thin film electrode 16 and the lower thin film electrode 14 or may be provided on only one of the upper thin film electrode 16 or the lower thin film electrode 14.

Further, the piezoelectric film 10 may further include an electrode lead portion that leads out the electrodes from the upper thin film electrode 16 and the lower thin film electrode 14, and an insulating layer which covers a region where the piezoelectric layer 12 is exposed for preventing a short circuit or the like, in addition to the above-described layers.

The electrode lead portion may be configured such that a portion where the thin film electrode and the protective layer project convexly outside the piezoelectric layer in the plane direction is provided or configured such that a part of the protective layer is removed to form a hole portion, and a conductive material such as silver paste is inserted into the hole portion so that the conductive material is conducted with the thin film electrode.

Each thin film electrode may have only one or two or more electrode lead portions. Particularly in a case of the configuration in which the electrode lead portion is obtained by removing a part of the protective layer and inserting a conductive material into the hole portion, it is preferable that the thin film electrode has three or more electrode lead portions in order to more reliably ensure the conduction.

The upper protective layer 20 and the lower protective layer 18 in the piezoelectric film 10 have a function of covering the upper thin film electrode 16 and the lower thin film electrode 14 and applying moderate rigidity and mechanical strength to the piezoelectric layer 12. That is, in the piezoelectric film 10 according to the embodiment of the present invention, the piezoelectric layer 12 consisting of the polymer matrix 24 and the piezoelectric particles 26 exhibits extremely excellent flexibility under bending deformation at a slow vibration, but may have insufficient rigidity or mechanical strength depending on the applications. As a compensation for this, the piezoelectric film 10 is provided with the upper protective layer 20 and the lower protective layer 18.

The lower protective layer 18 and the upper protective layer 20 have the same configuration except for the disposition position. Therefore, in the description below, in a case where it is not necessary to distinguish the lower protective layer 18 from the upper protective layer 20, both members are collectively referred to as a protective layer.

According to a more preferred embodiment, the piezoelectric film 10 in the example illustrated in the figure has the lower protective layer 18 and the upper protective layer 20 in a manner of being laminated on both thin film electrodes. However, the present invention is not limited thereto, and a configuration having only one of the lower protective layer 18 or the upper protective layer 20 may be employed.

The protective layer is not limited, and various sheet-like materials can be used as the protective layer, and suitable examples thereof include various resin films. Among these, from the viewpoints of excellent mechanical characteristics and heat resistance, a resin film consisting of polyethylene terephthalate (PET), polypropylene (PP), polystyrene (PS), polycarbonate (PC), polyphenylene sulfide (PPS), polymethylmethacrylate (PMMA), polyetherimide (PEI), polyimide (PI), polyamide (PA), polyethylene naphthalate (PEN), triacetyl cellulose (TAC), and a cyclic olefin-based resin is suitably used.

The thickness of the protective layer is not limited. In addition, the thicknesses of the upper protective layer 20 and the lower protective layer 18 are basically the same as each other, but may be different from each other.

Here, in a case where the rigidity of the protective layer is extremely high, not only is the stretch and contraction of the piezoelectric layer 12 constrained, but also the flexibility is impaired. Therefore, it is advantageous that the thickness of the protective layer decrease except for the case where the mechanical strength or excellent handleability as a sheet-like material is required.

Based on the examination conducted by the present inventors, in a case where the thickness of the upper protective layer 20 and the thickness of the lower protective layer 18 are respectively two times or less the thickness of the piezoelectric layer 12, preferable results in terms of achieving both ensuring of the rigidity and moderate elasticity can be obtained.

For example, in a case where the thickness of the piezoelectric layer 12 is 50 µm and the lower protective layer 18 and the upper protective layer 20 consist of PET, the thickness of the lower protective layer 18 and the thickness of the upper protective layer 20 are respectively preferably 100 µm or less, more preferably 50 µm or less, and still more preferably 25 µm or less.

In the piezoelectric film 10, the upper thin film electrode 16 is formed between the piezoelectric layer 12 and the upper protective layer 20, and the lower thin film electrode 14 is formed between the piezoelectric layer 12 and the lower protective layer 18. In the description below, the upper thin film electrode 16 is also referred to as an upper electrode 16, and the lower thin film electrode 14 is also referred to as a lower electrode 14.

The upper electrode 16 and the lower electrode 14 are provided to apply an electric field to the piezoelectric film 10 (piezoelectric layer 12).

Further, the lower electrode 14 and the upper electrode 16 are basically the same as each other. Therefore, in the description below, in a case where it is not necessary to distinguish the lower electrode 14 from the upper electrode 16, both members are collectively referred to as a thin film electrode.

In the present invention, the material for forming the thin film electrode is not limited, and various conductors can be used as the material. Specific examples thereof include conductive polymers such as carbon, palladium, iron, tin, aluminum, nickel, platinum, gold, silver, copper, chromium, molybdenum, alloys thereof, indium tin oxide, and polyethylene dioxythiophene-polystyrene sulfonic acid (PEDOT/PPS).

Among these, copper, aluminum, gold, silver, platinum, and indium tin oxide are suitable. Among these, from the viewpoints of the conductivity, the cost, and the flexibility, copper is more preferable.

In addition, the method of forming the thin film electrode is not limited, and various known methods such as a vapor-phase deposition method (a vacuum film forming method) such as vacuum vapor deposition or sputtering, a film forming method using plating, a method of bonding a foil formed of the materials described above, and a coating method can be used.

Among these, particularly from the viewpoint of ensuring the flexibility of the piezoelectric film 10, a thin film made of copper, aluminum, or the like formed by vacuum vapor deposition is suitably used as the thin film electrode. Among these, particularly a thin film made of copper formed by vacuum vapor deposition is suitably used.

The thickness of the upper electrode 16 and the lower electrode 14 is not limited. In addition, the thicknesses of the upper electrode 16 and the lower electrode 14 may be basically the same as or different from each other.

Here, similarly to the protective layer described above, in a case where the rigidity of the thin film electrode is extremely high, not only is the stretch and contraction of the piezoelectric layer 12 constrained, but also the flexibility is impaired. Therefore, it is advantageous that the thicknesses of the thin film electrode decreases in a case where the electric resistance is not excessively high.

It is suitable that the product of the thicknesses of the thin film electrode of the piezoelectric film 10 and the Young's modulus thereof is less than the product of the thickness of the protective layer and the Young's modulus thereof because the flexibility is not considerably impaired.

For example, in a case of a combination consisting of the protective layer formed of PET (Young's modulus: approximately 6.2 GPa) and the thin film electrode formed of copper (Young's modulus: approximately 130 GPa), the thickness of the thin film electrode is preferably 1.2 μm or less, more preferably 0.3 μm or less, and still more preferably 0.1 μm or less in a case of assuming that the thickness of the protective layer is 25 μm.

As described above, the piezoelectric film 10 has a configuration in which the piezoelectric layer 12 obtained by dispersing the piezoelectric particles 26 in the polymer matrix 24 containing the specific polymer is sandwiched between the upper electrode 16 and the lower electrode 14 and the laminate is further sandwiched between the upper protective layer 20 and the lower protective layer 18.

It is preferable that, in such a piezoelectric film 10, the maximal value at which the loss tangent (tan δ) at a frequency of 1 Hz according to dynamic viscoelasticity measurement is 0.1 or greater is present at room temperature.

In this manner, even in a case where the piezoelectric film 10 is subjected to bending deformation at a slow vibration of less than or equal to a few Hz from the outside, since the strain energy can be effectively diffused to the outside as heat, occurrence of cracks on the interface between the polymer matrix and the piezoelectric particles can be prevented.

In the piezoelectric film 10, it is preferable that the storage elastic modulus (E') at a frequency of 1 Hz according to the dynamic viscoelasticity measurement is 10 to 30 GPa at 0° C. and 1 to 10 GPa at 50° C.

In this manner, the piezoelectric film 10 may have large frequency dispersion in the storage elastic modulus (E') at room temperature. That is, the piezoelectric film 10 can exhibit a behavior of being rigid with respect to a vibration of 20 Hz to 20 kHz and being flexible with respect to a vibration of less than or equal to a few Hz.

In the piezoelectric film 10, it is preferable that the product of the thickness and the storage elastic modulus (F) at a frequency of 1 Hz according to the dynamic viscoelasticity measurement is in a range of $1.0 \times 10^6$ to $2.0 \times 10^6$ N/m at 0° C. and in a range of $1.0 \times 10^5$ to $1.0 \times 10^6$ N/m at 50° C.

In this manner, the piezoelectric film 10 may have moderate rigidity and mechanical strength within a range not impairing the flexibility and the acoustic characteristics.

Further, in the piezoelectric film 10, it is preferable that the loss tangent (Tan δ) at a frequency of 1 kHz at 25° C. is 0.05 or greater in a master curve obtained from the dynamic viscoelasticity measurement.

In this manner, the frequency of a speaker using the piezoelectric film 10 is smooth as the frequency characteristic thereof, and thus a change in acoustic quality in a case where the lowest resonance frequency $f_0$ is changed according to a change in the curvature of the speaker (piezoelectric film 10) can be decreased.

Figure 2:
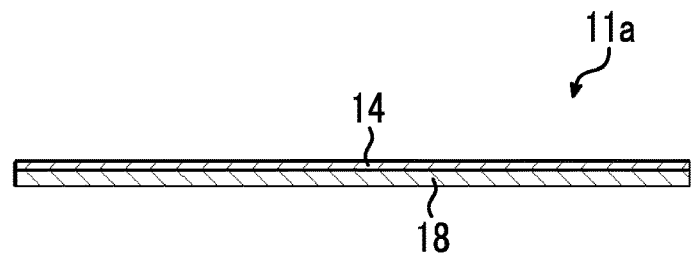
FIG. 2 is a conceptual view for describing a method of preparing the piezoelectric film illustrated in FIG. 1.
Figure 3:
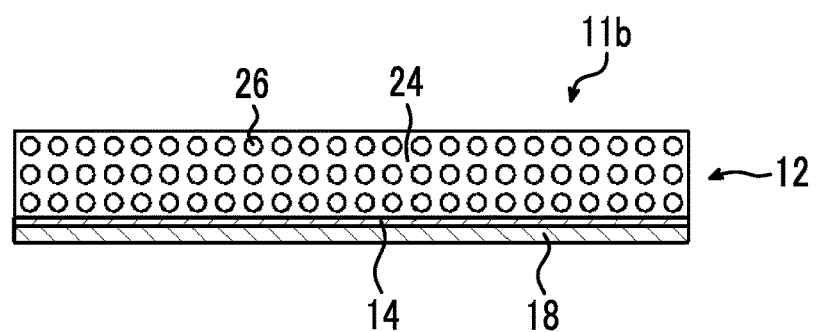
FIG. 3 is a conceptual view for describing a method of preparing the piezoelectric film illustrated in FIG. 1.
Figure 4:
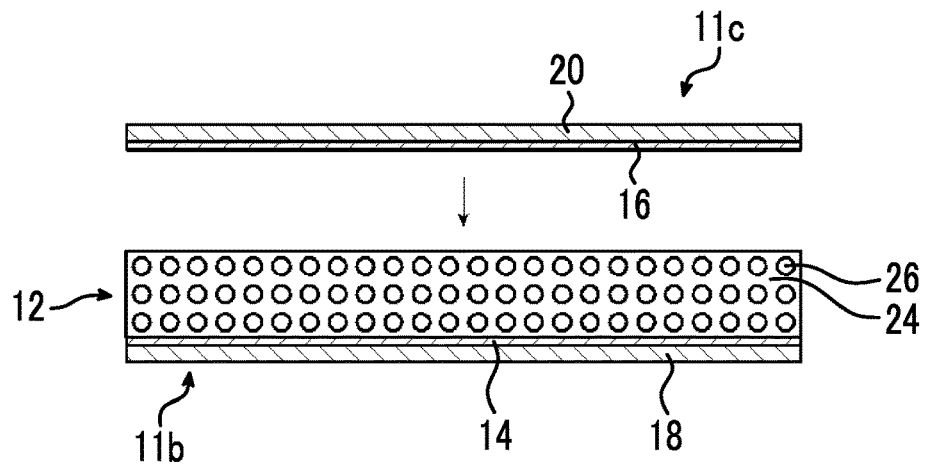
FIG. 4 is a conceptual view for describing a method of preparing the piezoelectric film illustrated in FIG. 1.

FIGS. 2 to 4 conceptually illustrates an example of the method of producing the piezoelectric film 10.

First, as illustrated in FIG. 2, a lower electrode laminate 11*a* which is a sheet-like material in which the lower electrode 14 is formed on the lower protective layer 18 is prepared.

Further, as illustrated in FIG. 4, an upper electrode laminate 11*c* which is a sheet-like material obtained by laminating the upper thin film electrode 16 and the upper protective layer 20 is prepared.

The lower electrode laminate 11*a* may be prepared by forming a copper thin film or the like as the lower thin film electrode 14 on the surface of the lower protective layer 18 using vacuum vapor deposition, sputtering, plating, or the like. Similarly, the upper electrode laminate 11*c* may be prepared by forming a copper thin film or the like as the upper thin film electrode 16 on the surface of the upper protective layer 20 using vacuum vapor deposition, sputtering, plating, or the like.

Alternatively, a commercially available sheet-like material in which a copper thin film or the like is formed on a protective layer may be used as the lower electrode laminate 11*a* and/or the upper electrode laminate 11*c*.

The lower electrode laminate 11*a* and the upper electrode laminate 11*c* may be exactly the same as or different from each other.

In a case where the protective layer is extremely thin and thus the handleability is degraded, a protective layer with a separator (temporary support) may be used as necessary. Further, a PET having a thickness of 25 μm to 100 μm or the like can be used as the separator. The separator may be removed after thermal compression bonding of the thin film electrode and the protective layer.

Next, as illustrated in FIG. 3, a laminate 11*b* obtained by laminating the lower electrode laminate 11*a* and the piezoelectric layer 12 is prepared by coating the lower electrode 14 of the lower electrode laminate 11*a* with a coating material (coating composition) that is the piezoelectric layer 12 and curing the material to form the piezoelectric layer 12.

First, the coating material is prepared by dissolving the specific polymer in an organic solvent, adding the piezoelectric particles 26 such as PZT particles thereto, and stirring the solution to disperse the particles.

The organic solvent is not limited, and various organic solvents such as dimethylformamide (DMF), methyl ethyl ketone, and cyclohexanone can be used.

In a case where the lower electrode laminate 11*a* is prepared and the coating material is prepared, the coating material is cast (applied) onto the lower electrode laminate 11*a*, and the organic solvent is evaporated and dried. In this manner, as illustrated in FIG. 3, a laminate 11*b* in which the lower electrode 14 is provided on the lower protective layer 18 and the piezoelectric layer 12 is laminated on the lower electrode 14 is prepared.

A casting method of the coating material is not limited, and all known methods (coating devices) such as a bar coater, a slide coater, and a doctor knife can be used.

Alternatively, in a case where the specific polymer is a material that can be heated and melted, the laminate 11b as illustrated in FIG. 3 may be prepared by heating and melting the specific polymer to prepare a melt obtained by adding and dispersing the piezoelectric particles 26, extruding the melt on the lower electrode laminate 11a illustrated in FIG. 2 in a sheet shape by carrying out extrusion molding or the like, and cooling the laminate.

As described above, in the piezoelectric film 10, a polymer piezoelectric material such as polyvinylidene fluoride (PVDF) may be added to the polymer matrix 24 in addition to the specific polymer.

In a case where the polymer piezoelectric material is added to the polymer matrix 24, the polymer piezoelectric material to be added to the coating material may be dissolved. Alternatively, the polymer piezoelectric material to be added may be added to the heated and melted specific polymer so that the polymer piezoelectric material is heated and melted.

Next, the piezoelectric layer 12 of the laminate 11b in which the lower electrode 14 is provided on the lower protective layer 18 and the piezoelectric layer 12 is formed on the lower electrode 14 is subjected to polarization treatment (poling).

The method of performing a polarization treatment on the piezoelectric layer 12 is not limited, and a known method can be used.

As an example, electric field poling in which a DC electric field is directly applied to the piezoelectric layer 12 is exemplified. Further, in a case of performing electric field poling, the electric filed poling treatment may be performed using the upper electrode 16 and the lower electrode 14 by forming the upper electrode 16 before the polarization treatment.

Further, in a case where the piezoelectric film 10 according to the embodiment of the present invention is produced, the polarization treatment is performed in the thickness direction of the piezoelectric layer 12 (polymer-based piezoelectric composite material) instead of the plane direction.

In addition, before the polarization treatment, a calender treatment of smoothing the surface of the piezoelectric layer 12 using a heating roller or the like may be performed. By performing the calender treatment, a thermal compression bonding step described below can be smoothly performed.

Next, as illustrated in FIG. 4, the upper electrode laminate 11c that has been prepared in advance is laminated on the piezoelectric layer 12 of the laminate 11b that has been subjected to the polarization treatment such that the upper electrode 16 is directed toward the piezoelectric layer 12.

Further, the piezoelectric film 10 according to the embodiment of the present invention as illustrate in FIG. 1 is prepared by performing thermal compression bonding on the laminate using a heating press device, a pair of heating rollers, or the like such that the lower protective layer 18 and the upper protective layer 20 are sandwiched and bonding the laminate 11b and the upper electrode laminate 11c to each other.

Further, the piezoelectric film 10 according to the embodiment of the present invention may be prepared by bonding or preferably compression-bonding the laminate 11b and the upper electrode laminate 11c to each other using an adhesive.

The piezoelectric film 10 according to the embodiment of the present invention to be prepared in the above-described manner is polarized in the thickness direction instead of the plane direction, and thus excellent piezoelectric characteristics are obtained even in a case where the stretching treatment is not performed after the polarization treatment. Therefore, the piezoelectric film 10 according to the embodiment of the present invention has no in-plane anisotropy as a piezoelectric characteristic, and stretches and contracts isotropically in all directions in the in-plane direction in a case where a driving voltage is applied.

The piezoelectric film 10 according to the embodiment of the present invention may be produced using the lower electrode laminate 11a and the upper electrode laminate 11c in a cut sheet shape and preferably using roll-to-roll (Roll to Roll). In the following description, roll-to-roll is also referred to as "RtoR".

As is well known, RtoR is a production method of pulling out a long raw material from a roll around which the raw material is wound, performing various treatments such as film formation and a surface treatment while transporting the raw material in the longitudinal direction, and winding the treated raw material into a roll shape again.

In a case where the piezoelectric film 10 is produced by the above-described production method by RtoR, a first roll obtained by winding the long lower electrode laminate 11a and a second roll obtained by winding the long upper electrode laminate 11c are used.

The first roll and the second roll may be exactly the same.

The laminate 11b obtained by laminating the lower electrode laminate 11a and the piezoelectric layer 12 is prepared by pulling out the lower electrode laminate 11a from the first roll, coating the lower electrode 14 of the lower electrode laminate 11a with the coating material containing the specific polymer and the piezoelectric particles 26 while the laminate is transported in the longitudinal direction, and drying the coating material by performing heating or the like to form the piezoelectric layer 12 on the lower electrode 14.

Next, the piezoelectric layer 12 is subjected to the polarization treatment. Here, in a case where the piezoelectric film 10 is produced by RtoR, the polarization treatment is performed on the piezoelectric layer 12 by a rod-like electrode disposed in a state of extending in a direction orthogonal to the transport direction of the laminate 10b while the laminate 10b is transported. Before the polarization treatment, the calender treatment may be performed as described above.

Next, the upper electrode laminate 11c is pulled out from the second roll, and the upper electrode laminate 11c is laminated on the laminate 10b such that the upper thin film electrode 16 is directed toward the piezoelectric layer 12 according to a known method of using a bonding roller or the like while the upper electrode laminate 11c and the laminate 11b are transported.

Thereafter, the laminate 10b and the upper electrode laminate 11c are sandwiched and transported by a pair of heating rollers to be subjected to thermal compression bonding to complete the piezoelectric film 10 according to the embodiment of the present invention, and the piezoelectric film 10 is wound in a roll shape.

In the above-described example, the piezoelectric film 10 according to the embodiment of the present invention is prepared by transporting the sheet-like material (laminate) only once in the longitudinal direction by RtoR, but the present invention is not limited thereto.

For example, the laminate is formed and subjected to the polarization treatment, and the laminate 11b is wound once into a roll shape to obtain a laminate roll. Next, the laminate 11b is pulled out from the laminate roll, the upper electrode laminate 11c is laminated and subjected to thermal compression bonding as described above while the laminate is transported in the longitudinal direction to prepare the piezoelectric film 10, and the piezoelectric film 10 may be wound into a roll shape.

Figure 5:
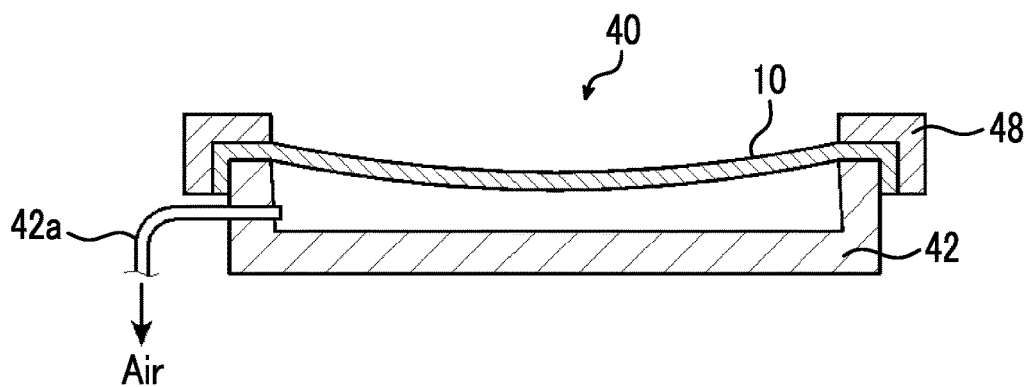
FIG. 5 is a view conceptually illustrating an example of a piezoelectric speaker formed of the piezoelectric film illustrated in FIG. 1.

FIG. 5 is a conceptual view illustrating an example of a flat plate type piezoelectric speaker including the piezoelectric film 10 according to the embodiment of the present invention.

The piezoelectric speaker 40 is a flat plate type piezoelectric speaker that uses the piezoelectric film 10 according to the embodiment of the present invention as a vibration plate that converts an electrical signal into vibration energy. Further, the piezoelectric speaker 40 can also be used as a microphone, a sensor, or the like.

The piezoelectric speaker 40 is configured to include the piezoelectric film 10, a case 42, and a pressing lid 48.

The case 42 is a cylindrical housing formed of plastic or the like and having one surface that is open. A pipe 42a to be inserted into the case 42 is provided on a side surface of the case 42.

Further, the pressing lid 48 is a frame having a substantially L-shaped cross section, and is inserted into the opening surface of the case 42 and fitted thereto.

In the piezoelectric speaker 40, the opening surface of the case 42 is airtightly blocked with the piezoelectric film 10 by covering the case 42 with the piezoelectric film 10 such that the opening surface is closed and fitting the pressing lid 48 to the case 42 from above the piezoelectric film 10. Further, an O-ring or the like for maintaining airtightness may be provided between the upper surface of the side wall of the case 42 and the piezoelectric film 10, as necessary.

In this state, the air inside the case 42 is released from the pipe 42a to maintain the piezoelectric film 10 in a concave state as illustrated in FIG. 5. On the contrary, the piezoelectric film 10 may be maintained in a convex state by introducing air into the case 42 from the pipe 42a.

In the piezoelectric speaker 40, in a case where the piezoelectric film 10 is stretched in the in-plane direction due to the application of a driving voltage to the lower electrode 14 and the upper electrode 16, the piezoelectric film 10 in a concave state due to decompression moves downward in order to absorb the stretched part.

On the contrary, in a case where the piezoelectric film 10 is contracted in the in-plane direction due to the application of a driving voltage to the lower electrode 14 and the upper electrode 16, the piezoelectric film 10 in a concave state moves upward in order to absorb the contracted part.

The piezoelectric speaker 40 generates a sound by the vibration of the piezoelectric film 10.

In the piezoelectric film 10 according to the embodiment of the present invention, the conversion from the stretching and contracting movement to vibration can also be achieved by holding the piezoelectric film 10 in a curved state.

Therefore, the piezoelectric film 10 according to the embodiment of the present invention can function as a piezoelectric speaker having flexibility by being simply maintained in a curved state instead of the piezoelectric speaker 40 having rigidity in a flat plate shape, as illustrated in FIG. 5.

The piezoelectric speaker formed of the piezoelectric film 10 according to the embodiment of the present invention can be stored in a bag or the like by, for example, being rolled or folded using the excellent flexibility. Therefore, with the piezoelectric film 10 according to the embodiment of the present invention, a piezoelectric speaker that can be easily carried even in a case where the piezoelectric speaker has a certain size can be realized.

Further, as described above, the piezoelectric film 10 according to the embodiment of the present invention has excellent elasticity and excellent flexibility, and has no in-plane anisotropy as a piezoelectric characteristic. Therefore, in the piezoelectric film 10 according to the embodiment of the present invention, a change in acoustic quality regardless of the direction in which the film is bent is small, and a change in acoustic quality with respect to the change in curvature is also small. Accordingly, the piezoelectric speaker formed of the piezoelectric film 10 according to the embodiment of the present invention has a high degree of freedom of the installation place and can be attached to various products as described above. For example, a so-called wearable speaker can be realized by attaching the piezoelectric film 10 according to the embodiment of the present invention to clothing such as a suit and portable items such as a bag in a curved state.

A flexible display according to the embodiment of the present invention is a flexible display using the piezoelectric film according to the embodiment of the present invention as a speaker.

Specifically, the flexible device according to the embodiment of the present invention is a speaker-mounted flexible display in which the piezoelectric film 10 according to the embodiment of the present invention is attached to, as a speaker, a surface of a sheet-like display device having flexibility, such as an organic EL display device having flexibility, a liquid crystal display device having flexibility, or an electronic paper having flexibility, on a side opposite to an image display surface. In the description below, the surface of the display device on a side opposite to the image display surface is also referred to as "the rear surface of the display device".

Further, the flexible display may be a color display or a monochrome display.

As described above, the piezoelectric film 10 according to the embodiment of the present invention has excellent elasticity and excellent flexibility, and has no in-plane anisotropy as a piezoelectric characteristic. Therefore, in the piezoelectric film 10 according to the embodiment of the present invention, a change in acoustic quality regardless of the direction in which the film is bent is small, and a change in acoustic quality with respect to the change in curvature is also small.

Therefore, the speaker-mounted flexible display according to the embodiment of the present invention in which the piezoelectric film 10 according to the embodiment of the present invention is attached to an image display device having flexibility has excellent flexibility and is capable of outputting a sound with a stabilized acoustic quality by suitably dealing with any deformation regardless of the direction of curvature and the amount of the curvature due to the state of the display being held in a hand or the like.

An example of the flexible display using the piezoelectric film according to the embodiment of the present invention as a speaker will be described with reference to FIGS. 6 to 8.

Figure 6:
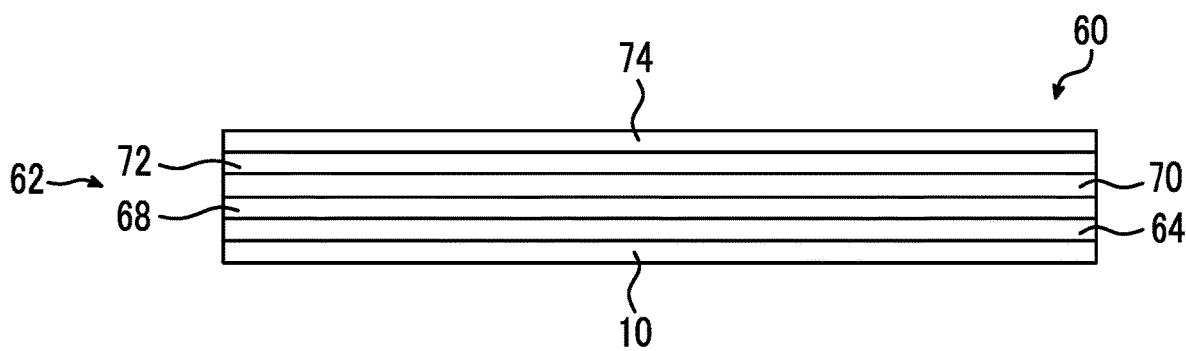
FIG. 6 is a view conceptually illustrating an example in which a flexible display according to the embodiment of the present invention is used as an organic electroluminescence display.

FIG. 6 is a cross-sectional view conceptually illustrating an example of the flexible display according to the embodiment of the present invention in which the piezoelectric film according to the embodiment of the present invention is used for an organic electroluminescence (EL) display.

An organic EL display 60 illustrated in FIG. 6 is a speaker-mounted organic EL flexible display in which the piezoelectric film 10 according to the embodiment of the present invention is attached to the rear surface of a sheet-like organic EL display device 62 having flexibility.

In the flexible display according to the embodiment of the present invention, the method of attaching the piezoelectric film 10 according to the embodiment of the present invention to the rear surface of a sheet-like image display device having flexibility such as the organic EL display device 62 is not limited. That is, all known methods of attaching (bonding) sheet-like materials in a state where the surfaces of the materials face each other can be used.

Examples thereof include a method of bonding materials with an adhesive, a method of bonding materials by thermal fusion welding, a method of using double-sided tape, a method of using pressure sensitive adhesive tape, a method of sandwiching a plurality of laminated sheet-like materials with ends or edges of the jig such as a substantially C-shaped clamp, a method of sandwiching a plurality of laminated sheet-like materials in a plane (excluding the image display surface) using a jig such as a rivet, a method of sandwiching a plurality of laminated sheet-like materials using protective films on both surfaces thereof (at least the image display side is transparent), and a method of combining any of these.

Further, in a case where the display device and the piezoelectric film 10 are bonded to each other using an adhesive or the like, the entire surfaces thereof may be bonded to each other, only the entire peripheries of the end portions may be bonded to each other, appropriately set places such as four corners and central portions may be bonded to each other in a dot shape, or any of these methods may be combined.

In the organic EL display 60, the piezoelectric film 10 is the above-described piezoelectric film 10 according to the embodiment of the present invention, including the piezoelectric layer 12 formed of the polymer-based piezoelectric composite material, the lower thin film electrode 14 provided on one surface of the piezoelectric layer 12, the upper thin film electrode 16 provided on the other surface, the lower protective layer 18 provided on the surface of the lower thin film electrode 14, and the upper protective layer 20 provided on the surface of the upper thin film electrode 16.

In addition, the organic EL display device 62 is a known sheet-like organic EL display device (organic EL display panel) having flexibility.

That is, as an example, the organic EL display device 62 includes an anode 68 in which a pixel electrode having a switching circuit such as a thin film transistor (TFT) is formed on a substrate 64 such as a plastic film, a light emitting layer 70 formed of an organic EL material on the anode 68, a transparent cathode 72 consisting of indium tin oxide (ITO) or the like on the light emitting layer 70, and a transparent substrate 74 formed of plastic or the like on the cathode 72.

Further, a hole injection layer or a hole transport layer may be provided between the anode 68 and the light emitting layer 70, and an electron transport layer or an electron injection layer may be provided between the light emitting layer 70 and the cathode 72. Further, a protective film such as a gas barrier film may be provided on the transparent substrate 74.

Although not illustrated in the figure, the piezoelectric film 10, that is, the wiring for driving the speaker is connected to the lower electrode 14 and the upper electrode 16 of the piezoelectric film 10. Further, wiring for driving the organic EL display device 62 is connected to the anode 68 and the cathode 72.

The same applies to an electronic paper 78 and a liquid crystal display 94 described below.

Figure 7:
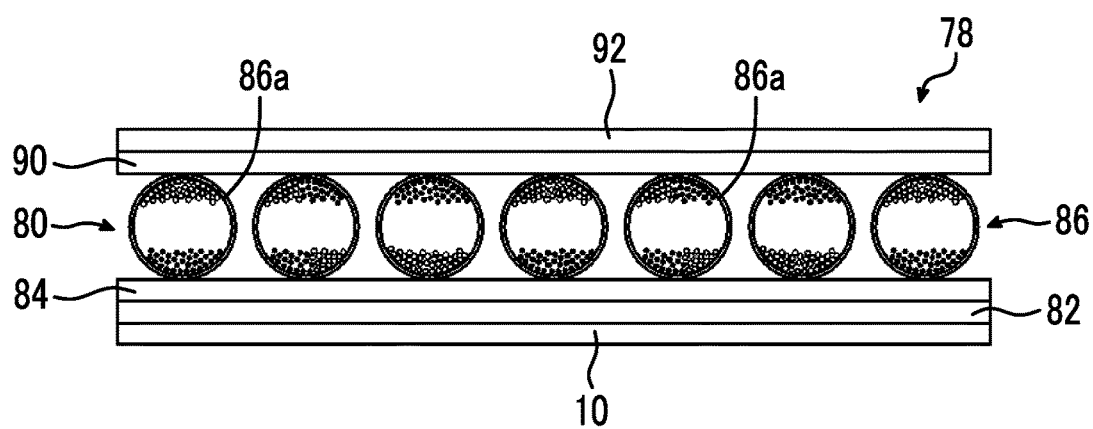
FIG. 7 is a view conceptually illustrating an example in which the flexible display according to the embodiment of the present invention is used as electronic paper.

FIG. 7 conceptually illustrates an example of the flexible display according to the embodiment of the present invention in which the piezoelectric film according to the embodiment of the present invention is used as electronic paper.

The electronic paper 78 illustrated in FIG. 7 is a speaker-mounted electronic paper in which the piezoelectric film 10 according to the embodiment of the present invention is attached to the rear surface of the sheet-like electronic paper device 80 having flexibility.

In the electronic paper 78, the piezoelectric film 10 is the same as described above.

In addition, the electronic paper device 80 is an electronic paper having known flexibility. That is, as an example, the electronic paper device 80 includes a lower electrode 84 in which a pixel electrode having a switching circuit such as a TFT is formed on a substrate 82 such as a plastic film, a display layer 86 in which microcapsules 86a containing white and black pigments that are positively or negatively charged are arranged on the lower electrode 84, a transparent upper electrode 90 consisting of ITO and the like which is provided on the display layer 86, and a transparent substrate 92 formed of transparent plastic on the upper electrode 90.

Further, the example illustrated in FIG. 7 is an example in which the flexible display of the present invention is used as an electrophoresis type electronic paper formed of microcapsules, but the present invention is not limited thereto.

That is, all known electronic papers such as an electrophoresis type electronic paper that does not contain microcapsules, a chemical change type electronic paper that uses an oxidation reduction reaction, an electronic powder type electronic paper, an electrowetting type electronic paper, a liquid crystal type electronic paper can be used as the flexible display according to the embodiment of the present invention as long as the electronic paper is a sheet like material having flexibility.

Figure 8:
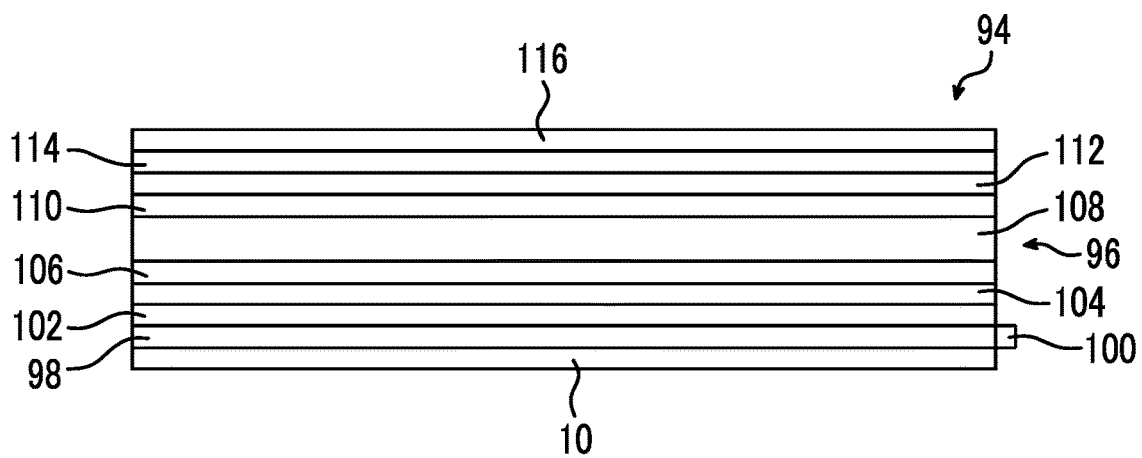
FIG. 8 is a view conceptually showing an example in which the flexible display according to the embodiment of the present invention is used as a liquid crystal display.

FIG. 8 conceptually illustrates an example in which the piezoelectric film according to the embodiment of the present invention is used for a liquid crystal display (LCD).

The liquid crystal display 94 illustrated in FIG. 8 is a speaker-mounted liquid crystal flexible display in which the piezoelectric film 10 according to the embodiment of the present invention is attached to the rear surface of a sheet-like liquid crystal display device 96 having flexibility.

In the liquid crystal display 94, the piezoelectric film 10 is the same film as described above.

Meanwhile, the liquid crystal display device 96 is a known sheet-like liquid crystal display device (liquid crystal display panel) having flexibility. That is, as an example, the liquid crystal display device 96 includes an edge light type light guide plate 98 having flexibility and a light source 100 that allows backlight to be incident from an end portion of the light guide plate 98. As an example, the liquid crystal display device 96 includes a polarizer 102 on the light guide plate 98, a transparent lower substrate 104 on the polarizer 102, a transparent lower electrode 106 in which a pixel electrode having a switching circuit such as a TFT is formed on the lower substrate 104, a liquid crystal layer 108 on the lower electrode 106, a transparent upper electrode 110 consisting of ITO and the like which is provided on the liquid crystal layer 108, a transparent upper substrate 112 on the upper electrode 110, a polarizer 114 on the upper substrate 112, and a protective film 116 on the polarizer 114.

Further, the flexible display according to the embodiment of the present invention is not limited to the organic EL displays, the electronic papers, and the liquid crystal displays, and image display devices formed of various display devices can be used as long as the display devices are sheet-like display devices (display panels) having flexibility.

The vocal cord microphone and the sensor for a musical instrument according to the embodiment of the present invention are a vocal cord microphones and a sensor for a musical instrument formed of the piezoelectric film according to the embodiment of the present invention.

In the piezoelectric film 10 according to the embodiment of the present invention, including the piezoelectric layer 12 obtained by dispersing the piezoelectric particles 26 in the polymer matrix 24, the lower thin film electrode 14 and the upper thin film electrode 16 which are provided on the surfaces of the piezoelectric layer 12, and the lower protective layer 18 and the upper protective layer 20 which are provided on both surfaces of each of the thin film electrodes, the piezoelectric layer 12 also has a performance of converting vibration energy into an electric signal.

Therefore, the piezoelectric film 10 according to the embodiment of the present invention can be suitably used for a microphone or a sensor (pickup) for a musical instrument by using the piezoelectric film 10.

Figure 9:
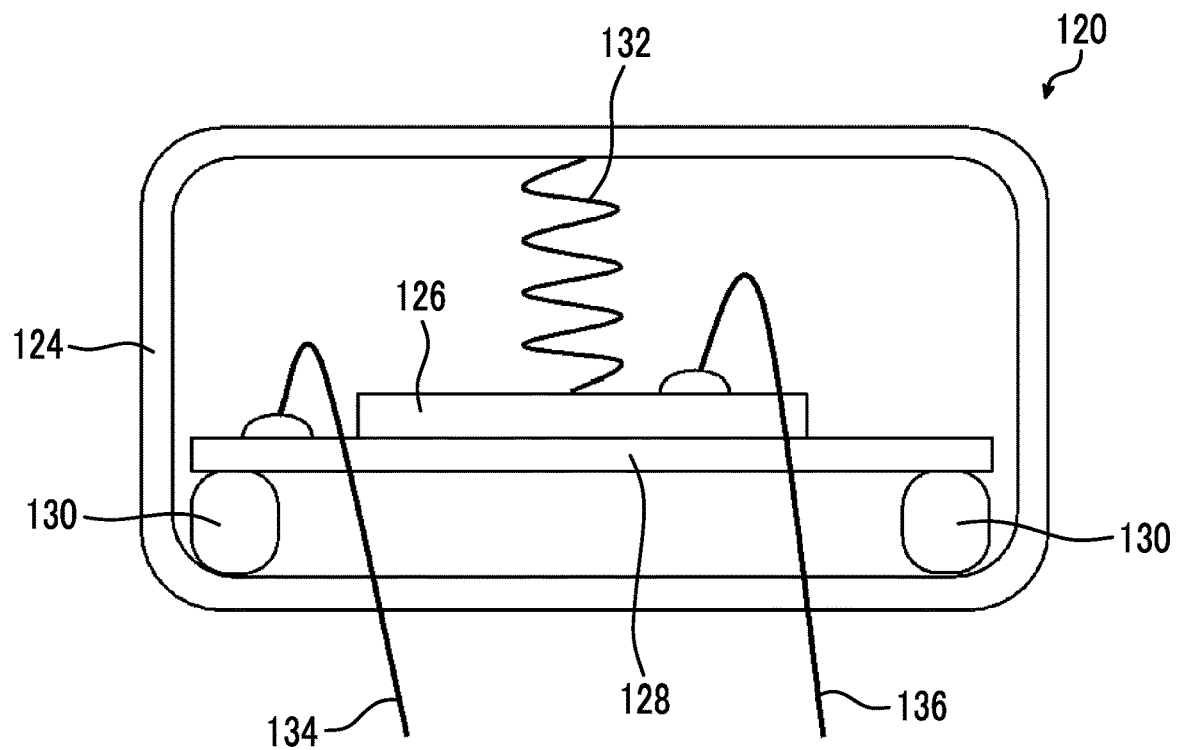
FIG. 9 is a view conceptually illustrating a configuration of a typical vocal cord microphone.

FIG. 9 conceptually illustrates an example of a typical vocal cord microphone.

As illustrated in FIG. 9, a typical vocal cord microphone 120 of the related art has a complicated configuration in which a piezoelectric ceramic 126 such as PZT is laminated on a metal plate 128 such as a brass plate, a cushion 130 having elasticity is supported in a case 124 in a state where a spring 132 is attached to the upper surface, and signal lines 134 and 136 are pulled out from the case.

On the contrary, the vocal cord microphone according to the embodiment of the present invention in which the piezoelectric film 10 according to the embodiment of the present invention is used as a sensor that converts a voice signal into an electric signal can be simply configured such that an attaching unit is provided on the piezoelectric film 10 and a signal line for extracting an electric signal output by the piezoelectric layer 12 (the lower electrode 14 and the upper electrode 16) is provided.

Further, the vocal cord microphone according to the embodiment of the present invention which has such a configuration acts as a vocal cord microphone only by attaching the piezoelectric film 10 provided with a signal line for extracting an electric signal to the vicinity of the vocal cord.

Further, as illustrated in FIG. 9, since the vocal cord microphone of the related art which is formed of the piezoelectric ceramic 126 and the metal plate 128 has an extremely small loss tangent, resonance is likely to occur extremely strongly so that the frequency characteristics fluctuate, and thus the tone tends to be metallic.

On the contrary, as described above, since the piezoelectric film 10 according to the embodiment of the present invention has excellent flexibility and acoustic characteristics and the change in acoustic quality during deformation is small, the piezoelectric film 10 can be attached to a throat portion of a person with a complicated curved surface, and the sound can be reliably reproduced from a low sound to a high sound.

That is, according to the present invention, an ultra-lightweight and space-saving vocal cord microphone which is capable of outputting a voice signal that is extremely close to the real voice, does not make a user have a feeling of wearing, and is simply configured can be realized.

In the vocal cord microphone according to the embodiment of the present invention, the method of attaching the piezoelectric film 10 to the vicinity of the vocal cord is not limited, and various known methods of attaching sheet-like materials can be used.

Further, the piezoelectric film 10 may be attached to the vicinity of the vocal cord by storing the piezoelectric film 10 in an ultra-thin case or a bag without directly attaching the piezoelectric film 10 to the vicinity of the vocal cord.

Further, the sensor for a musical instrument according to the embodiment of the present invention in which the piezoelectric film 10 according to the embodiment of the present invention is used as a sensor that converts a voice signal into an electric signal can be simply configured such that an attaching unit is provided on the piezoelectric film 10 and a signal line for extracting an electric signal output by the piezoelectric layer 12 (the lower electrode 14 and the upper electrode 16) is provided.

Further, the sensor for a musical instrument according to the embodiment of the present invention which has such a configuration acts as a sensor for a musical instrument (that is, a pickup) only by attaching the piezoelectric film 10 provided with a signal line for extracting an electric signal to a part of a musical instrument.

Similar to the vocal cord microphone described above, since the piezoelectric film 10 according to the embodiment of the present invention is thin and highly elastic, the sensor for a musical instrument according to the embodiment of the present invention has excellent flexibility and excellent acoustic characteristics and the change in acoustic quality during deformation is small, and thus the piezoelectric film 10 can be attached to a housing of a musical instrument with a complicated curved surface, and the sound of the musical instrument can be reliably reproduced from a low sound to a high sound.

In addition, since the sensor for a musical instrument according to the embodiment of the present invention has almost no mechanical constraint on the surface of a housing of a vibrating musical instrument, the influence of attaching the pickup on the original sound of the musical instrument can be minimized.

Similar to the vocal cord microphone described above, in the sensor for a musical instrument according to the embodiment of the present invention, the method of attaching the sensor to the musical instrument is not limited, and various known methods of bonding sheet-like materials can be used. Further, in the sensor for a musical instrument according to the embodiment of the present invention, the piezoelectric film 10 may be stored in an ultra-thin case or a bag and attached to a musical instrument.

As described above, the piezoelectric film 10 according to the embodiment of the present invention stretches and contracts in the plane direction in a case where a voltage is applied, and vibrates suitably in the thickness direction due to the stretch and contraction in the plane direction, and thus a sound with a high sound voltage can be output and excellent acoustic characteristics are exhibited in a case where the piezoelectric film 10 is used for a piezoelectric speaker or the like.

The piezoelectric film 10 according to the embodiment of the present invention, which exhibits excellent acoustic characteristics and high stretch and contraction performance due to piezoelectricity can be satisfactorily used as a piezoelectric vibrating element that vibrates a vibration body such as a vibration plate by laminating a plurality of the piezoelectric films.

Further, in a case where a plurality of the piezoelectric films 10 are laminated, each piezoelectric film to be laminated may not have the upper protective layer 20 and/or the lower protective layer 18 unless there is a possibility of a short circuit. Alternatively, the piezoelectric film that does not have the upper protective layer 20 and/or the lower protective layer 18 may be laminated through an insulating layer.

As an example, a speaker in which a laminate of the piezoelectric films 10 is bonded to the vibration plate and the vibration plate is vibrated by the laminate of the piezoelectric films 10 to output a sound may be used. That is, in this case, the laminate of the piezoelectric film 10 acts as a so-called exciter that outputs a sound by vibrating the vibration plate.

By applying a driving voltage to the laminated piezoelectric films 10, each piezoelectric film 10 stretches and contracts in the plane direction, and the entire laminate of the piezoelectric film 10 stretches and contracts in the plane direction due to the stretch and contraction of each piezoelectric film 10. The vibration plate to which the laminate has been attached is bent due to the stretch and contraction of the laminate of the piezoelectric film 10 in the plane direction, and thus the vibration plate vibrates in the thickness direction. The vibration plate generates a sound using the vibration in the thickness direction. The vibration plate vibrates according to the magnitude of the driving voltage applied to the piezoelectric film 10 and generates a sound according to the driving voltage applied to the piezoelectric film 10.

Therefore, the piezoelectric film 10 itself does not output sound in this case.

Therefore, even in a case where the rigidity of each piezoelectric film 10 is low and the stretching and contracting force thereof is small, the rigidity is increased by laminating the piezoelectric films 10, and the stretching and contracting force as the entire laminate is increased. As a result, in the laminate of the piezoelectric films 10, even in a case where the vibration plate has a certain degree of rigidity, the vibration plate is sufficiently bent with a large force and the vibration plate can be sufficiently vibrated in the thickness direction, whereby the vibration plate can generate a sound.

In the laminate of the piezoelectric film 10, the number of laminated piezoelectric films 10 is not limited, and the number of sheets set such that a sufficient amount of vibration is obtained may be appropriately set according to, for example, the rigidity of the vibration plate to be vibrated.

Further, one piezoelectric film 10 according to embodiment of the present invention can also be used as a similar exciter (piezoelectric vibrating element) in a case where the piezoelectric film has a sufficient stretching and contracting force.

The vibration plate vibrated by the laminate of the piezoelectric film 10 according to the embodiment of the present invention is not limited, and various sheet-like materials (such as plate-like materials and films) can be used.

Examples thereof include a resin film consisting of PET and the like, foamed plastic consisting of foamed polystyrene and the like, a paper material such as a corrugated cardboard material, a glass plate, and wood. Further, a device such as a display device may be used as the vibration plate in a case where the device can be sufficiently bent.

It is preferable that the laminate 10 of the piezoelectric film 10 according to the embodiment of the present invention is obtained by bonding adjacent piezoelectric films with a bonding layer (bonding agent). Further, it is preferable that the laminate of the piezoelectric film 10 and the vibration plate are also bonded to each other with a bonding layer.

The bonding layer is not limited, and various layers that can bond materials to be bonded can be used. Therefore, the bonding layer may consist of a pressure sensitive adhesive or an adhesive. It is preferable that a bonding layer consisting of an adhesive is used from the viewpoint that a solid and hard bonding layer is obtained after the bonding.

The same applies to the laminate formed by folding back the long piezoelectric film 10 described later.

In the laminate of the piezoelectric films 10, the polarization direction of each piezoelectric film 10 to be laminated is not limited. As described above, the polarization direction of the piezoelectric film 10 according to the embodiment of the present invention is the polarization direction in the thickness direction.

Therefore, in the laminate of the piezoelectric films 10, the polarization directions may be the same for all the piezoelectric films 10, and piezoelectric films having different polarization directions may be present.

Here, in the laminate of the piezoelectric films 10, it is preferable that the piezoelectric films 10 are laminated such that the polarization directions of the adjacent piezoelectric films 10 are opposite to each other.

In the piezoelectric film 10, the polarity of the voltage to be applied to the piezoelectric layer 12 depends on the polarization direction. Therefore, even in a case where the polarization direction is directed from the upper electrode 16 toward the lower electrode 14 or from the lower electrode 14 toward the upper electrode 16, the polarity of the upper electrode 16 and the polarity of the lower electrode 14 in all the piezoelectric films 10 to be laminated are set to be the same polarity.

Therefore, by reversing the polarization directions of the adjacent piezoelectric films 10, even in a case where the electrodes of the adjacent piezoelectric films 10 come into contact with each other, the electrodes in contact with each other have the same polarity, and thus there is no risk of a short circuit.

The laminate of the piezoelectric film 10 may be configured such that a long piezoelectric film 10 is folded back, for example, once or more times, or preferably a plurality of times to laminate a plurality of layers of the piezoelectric films 10.

The configuration in which the long piezoelectric film 10 is folded back and laminated has the following advantages.

That is, in the laminate in which a plurality of cut sheet-like piezoelectric films 10 are laminated, the upper electrode 16 and the lower electrode 14 need to be connected to a driving power source for each piezoelectric film. On the contrary, in the configuration in which the long piezoelectric film 10 is folded back and laminated, only one sheet of the long piezoelectric film 10 can form the laminate. Further, in the configuration in which the long piezoelectric film 10 is folded back and laminated, only one power source is required for applying the driving voltage, and the electrode may be pulled out from the piezoelectric film 10 at one place.

Further, in the configuration in which the long piezoelectric film 10 is folded back and laminated, the polarization directions of the adjacent piezoelectric films 10 are inevitably opposite to each other.

Hereinbefore, the polymer-based piezoelectric composite material, the piezoelectric film, the piezoelectric speaker, the flexible display, the vocal cord microphone, and the sensor for a musical instrument according to the embodiment of the present invention have been described in detail, but the present invention is not limited to the above-described examples, and various improvements or modifications may be made within a range not departing from the scope of the present invention.

EXAMPLES

Hereinafter, the present invention will be described in more detail with reference to specific examples of the present invention. Further, the present invention is not limited to the examples, and the materials, the used amounts, the proportions, the treatment contents, the treatment procedures, and the like shown in the following examples can be appropriately changed within a range not departing from the scope of the present invention.

Synthesis Example 1: Synthesis of Monomer M-1

Acrylic acid (72.1 g), 4-chlorobutyronitrile (103.6 g), and ethyl acetate (600 mL) were mixed with each other. Triethylamine (121.4 g) was added dropwise to the solution, potassium iodide (332.0 g) was further added thereto, and the solution was allowed to react at 80° C. for 8 hours. The obtained solution was cooled to room temperature, and the deposited salt was removed by filtration. The obtained solution was washed with water and dilute hydrochloric acid and dried over magnesium sulfate. Thereafter, the obtained solution was concentrated under reduced pressure, thereby obtaining a monomer M-1 (133.6 g) represented by the following formula.

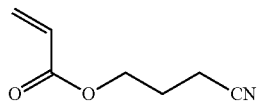

Synthesis Example 2: Synthesis of Monomer M-2

Acrylic acid (72.1 g), 7-chloroheptanonitrile (145.6 g), and ethyl acetate (600 mL) were mixed with each other. Triethylamine (121.4 g) was added dropwise to the solution, potassium iodide (332.0 g) was further added thereto, and the solution was allowed to react at 80° C. for 8 hours. The obtained solution was cooled to room temperature, and the deposited salt was removed by filtration. The obtained solution was washed with water and dilute hydrochloric acid and dried over magnesium sulfate. Thereafter, the obtained solution was concentrated under reduced pressure, thereby obtaining a monomer M-2 (120.1 g) represented by the following formula.

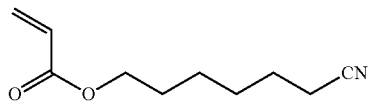

Synthesis Example 3: Synthesis of Polymer of Example 1

Cyclohexanone (5.0 g) was added to a three-neck flask and heated to 80° C. in a nitrogen atmosphere. A solution obtained by dissolving the monomer M-1 (20.0 g) and azobisisobutyronitrile (AIBN) (78 mg) in cyclohexanone (15.0 g) was added dropwise to the solution over 3 hours. After completion of the dropwise addition, the obtained solution was heated to 90° C. and stirred for 3 hours, and the reaction was completed. Cyclohexanone (26.2 g) was added to the obtained solution, thereby obtaining a cyclohexanone solution having a polymer concentration of 30% by mass. The weight-average molecular weight of the obtained polymer was 40000.

Synthesis Example 4: Synthesis of Polymer of Example 2

Cyclohexanone (5.0 g) was added to a three-neck flask and heated to 80° C. in a nitrogen atmosphere. A solution obtained by dissolving the monomer M-1 (18.7 g), methyl acrylate (1.3 g), and AIBN (232 mg) in cyclohexanone (15.0 g) was added dropwise to the solution over 3 hours. After completion of the dropwise addition, the obtained solution was heated to 90° C. and stirred for 3 hours, and the reaction was completed. Cyclohexanone (26.2 g) was added to the obtained solution, thereby obtaining a cyclohexanone solution having a polymer concentration of 30% by mass. The weight-average molecular weight of the obtained polymer was 13000.

Synthesis Example 5: Synthesis of Polymer of Example 3

Cyclohexanone (5.0 g) was added to a three-neck flask and heated to 80° C. in a nitrogen atmosphere. A solution obtained by dissolving the monomer M-1 (18.3 g), 2-hydroxyethyl acrylate (1.7 g), and AIBN (108 mg) in cyclohexanone (15.0 g) was added dropwise to the solution over 3 hours. After completion of the dropwise addition, the obtained solution was heated to 90° C. and stirred for 3 hours, and the reaction was completed. Cyclohexanone (26.2 g) was added to the obtained solution, thereby obtaining a cyclohexanone solution having a polymer concentration of 30% by mass. The weight-average molecular weight of the obtained polymer was 32000.

Synthesis Example 6: Synthesis of Polymer of Example 4

Cyclohexanone (5.0 g) was added to a three-neck flask and heated to 80° C. in a nitrogen atmosphere. A solution obtained by dissolving the monomer M-1 (18.9 g), acrylic acid (1.1 g), and AIBN (86 mg) in cyclohexanone (15.0 g) was added dropwise to the solution over 3 hours. After completion of the dropwise addition, the obtained solution was heated to 90° C. and stirred for 3 hours, and the reaction was completed. Cyclohexanone (26.2 g) was added to the obtained solution, thereby obtaining a cyclohexanone solution having a polymer concentration of 30% by mass. The weight-average molecular weight of the obtained polymer was 72000.

Synthesis Example 7: Synthesis of Polymer of Example 5

Cyclohexanone (5.0 g) was added to a three-neck flask and heated to 80° C. in a nitrogen atmosphere. A solution obtained by dissolving the monomer M-2 (20.0 g) and AIBN (141 mg) in cyclohexanone (15.0 g) was added dropwise to the solution over 3 hours. After completion of the dropwise addition, the obtained solution was heated to 90° C. and stirred for 3 hours, and the reaction was completed. Cyclohexanone (26.2 g) was added to the obtained solution, thereby obtaining a cyclohexanone solution having a polymer concentration of 30% by mass. The weight-average molecular weight of the obtained polymer was 17000.

Synthesis Example 8: Synthesis of Polymer of Example 6

Polyvinyl alcohol (2.0 g) and water (15.1 g) were added to a three-neck flask. Cyanopropyl acetic acid (5.1 g), 1-ethyl-3-(3-dimethylaminopropyl) carbodiimide hydrochloride (8.7 g), and acetone (10 g) were added with the solution and the resulting solution was allowed to react at 25° C. for 8 hours. In a case where the solution was allowed to react after the reaction, since the obtained solution was divided into two phases, the upper phase was separated and added dropwise to ion exchange water, thereby obtaining a precipitate. The precipitate was collected by filtration and dried. The obtained solid was dissolved in acetone, precipitated in ion exchange water, collected by filtration, and dried, thereby obtaining a polymer. The weight-average molecular weight of the obtained polymer was 45000.

Synthesis Example 9: Synthesis of Polymer of Comparative Example 1

Cyclohexanone (5.0 g) was added to a three-neck flask and heated to 80° C. in a nitrogen atmosphere. A solution obtained by dissolving 2-cyanoethyl methacrylate (20.0 g, manufactured by Fujifilm Wako Pure Chemical Corporation) and AIBN (78 mg) in cyclohexanone (15.0 g) was added dropwise to the solution over 3 hours. After completion of the dropwise addition, the obtained solution was heated to 90° C. and stirred for 3 hours, and the reaction was completed. Cyclohexanone (26.2 g) was added to the obtained solution, thereby obtaining a cyclohexanone solution having a polymer concentration of 30% by mass. The weight-average molecular weight of the obtained polymer was 40000.

Synthesis Example 10: Synthesis of Monomer M-3

4-Hydroxybutyronitrile (25.5 g), tetrahydrofuran (100 mL), and dibutyl tin dilaurate (1 drop) were mixed in a three-neck flask. KARENZ MOI (46.5 g) was added dropwise to the solution, and the solution was allowed to react at 60° C. for 6 hours. The obtained solution was cooled to room temperature, ethyl acetate (100 mL) was added to the solution, and the solution was washed with water and dried over magnesium sulfate. Thereafter, the obtained solution was concentrated under reduced pressure, thereby obtaining a monomer M-3 (64.9 g).

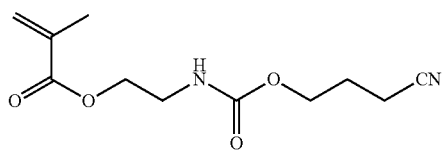 [SMILES: C=C(C)C(=O)OCCNC(=O)OCCCC#N]

Synthesis Example 11: Synthesis of Polymer of Comparative Example 3

Cyclohexanone (5.0 g) was added to a three-neck flask and heated to 80° C. in a nitrogen atmosphere. A solution obtained by dissolving the monomer M-3 (20.0 g) and AIBN (53 mg) in cyclohexanone (15.0 g) was added dropwise to the solution over 3 hours. After completion of the dropwise addition, the obtained solution was heated to 90° C. and stirred for 3 hours, and the reaction was completed. Cyclohexanone (26.2 g) was added to the obtained solution, thereby obtaining a cyclohexanone solution having a polymer concentration of 30% by mass. The weight-average molecular weight of the obtained polymer was 25000.

Examples 1 to 6 and Comparative Examples 1 to 3: Preparation of Piezoelectric Film The piezoelectric film 10 illustrated in FIG. 1 was prepared by the method illustrated in FIGS. 2 to 4 described above.

First, PZT particles were added to a 30 mass % cyclohexanone solution of a predetermined polymer used in each example and each comparative example at the following composition ratio and dispersed by a propeller mixer (rotation speed of 2000 rpm), thereby preparing a coating material for forming the piezoelectric layer 12.

PZT Particles: 300 parts by mass
30 Mass % cyclohexanone solution of predetermined polymer: 100 parts by mass In addition, PZT particles obtained by sintering commercially available PZT raw material powder at 1000° C. to 1200° C. and thereafter crushing and classifying the sintered powder to have an average particle diameter of 5 μm were used as the PZT particles.

Further, two sheet-like materials (corresponding to the lower electrode laminate 11a and the upper electrode laminate 11c) prepared by vacuum-depositing a copper thin film with a thickness of 0.1 μm on a PET film having a thickness of 4 μm were prepared. That is, in the present example, the lower thin film electrode 14 and the upper thin film electrode 16 are copper vapor deposition thin films having a thickness of 0.1 μm, and the lower protective layer 18 and the upper protective layer 20 are PET films having a thickness of 4 μm.

The copper vapor deposition thin film (lower thin film electrode 14) of the sheet-like material (lower electrode laminate 11a) was coated with the coating material for forming the piezoelectric layer 12 prepared in advance using a slide coater. Further, the coating material was applied such that the film thickness of the coating film after being dried reached 40 μm.

Next, cyclohexanone was evaporated by heating and drying the material obtained by coating the copper vapor deposition thin film (lower thin film electrode 14) with the coating material on a hot plate at 120° C. In this manner, a laminate (laminate 11b) in which the lower thin film electrode 14 made of copper was provided on the lower protective layer 18 made of PET and the piezoelectric layer 12 having a thickness of 40 μm was formed thereon was prepared.

Next, the piezoelectric layer 12 of the laminate 11b was subjected to a polarization treatment.

The upper electrode laminate 11c was laminated on the laminate 11b that had been subjected to the polarization treatment in a state where the upper thin film electrode 16 (copper thin film side) was directed toward the piezoelectric layer 12.

Next, the laminate of the laminate 11b and the upper electrode laminate 11c was subjected to thermal compression bonding at 120° C. using a laminator device to bond the piezoelectric layer 12, the lower thin film electrode 14, and the upper thin film electrode 16, thereby preparing the piezoelectric film 10.

<Preparation of Piezoelectric Speaker>

A circular test piece having a diameter of 70 mm was cut out from the prepared piezoelectric film, thereby preparing a piezoelectric speaker as illustrated in FIG. 5.

The case was a cylindrical container with one opening surface, and a plastic cylindrical container having an opening portion with a diameter of 60 mm and a depth of 10 mm was used.

The piezoelectric film was disposed such that the opening portion of the case was covered, the peripheral portion was fixed with a pressing lid, the air inside the case was exhausted from a pipe, the pressure inside the case was maintained at 0.09 MPa, and the piezoelectric film was curved in a concave shape, thereby preparing a piezoelectric speaker.

<Piezoelectric Characteristics: Evaluation of Sound Pressure>

The level of the sound pressure of the prepared piezoelectric speaker was measured.

Specifically, the level of the sound pressure was measured by disposing a microphone at a position separated from the center of the piezoelectric film of the piezoelectric speaker by 0.5 m and inputting a 10 V0-P sine wave with a frequency of 1 kHz to a space between the upper electrode and the lower electrode of the piezoelectric film. Further, the evaluation was performed based on the following evaluation standards.

The evaluation was performed as follows based on a difference in sound pressure level between each example and Comparative Example 2 (sound pressure level of each example or comparative example—sound pressure level of Comparative Example 2).

A case where the difference in sound pressure level between the example and Comparative Example 2 was greater than 1 dB was evaluated as "A".

A case where the difference in sound pressure level between the example and Comparative Example 2 was 1 dB or less was evaluated as "B".

<Flexibility Test>

A strip-like test piece having a size of 1 cm×15 cm was prepared from the prepared piezoelectric film.

The test piece was allowed to stand in a temperature environment of −20° C. for 1 hour, an operation of rolling the test piece to have a predetermined radius of curvature (r=5 cm, r=2.5 cm, and r=0.5 cm) in the environment and returning the test piece to the original state was repeatedly performed twice, and a change in the electrical characteristics (the capacitance and the dielectric loss) and a change in the appearance were examined.

A case where a change in the electrical characteristics and a change in the appearance were not found was evaluated as A, a case where a change in the electrical characteristics was not found but traces such as creases remained was evaluated as B, and a case where a change in the electrical characteristics was found was evaluated as C.

The evaluation results are collectively listed in Table 1.

In Table 1, the columns of "polymer" indicate the structure of polymer used. The numerical value in the structural formula of each polymer indicates the content (% by mole) of each repeating unit with respect to all the repeating units in the polymer.

TABLE 1

| | Polymer | | Evaluation | |
| --- | --- | --- | --- | --- |
| | Type | Mw | Sound pressure | Flexibility |
| Example 1 | [polymer structure: 100 mol% repeating unit with −C(=O)−O−(CH₂)₃−CN side chain] | 40000 | A | A |
| Example 2 | [copolymer: 90 mol% −C(=O)−O−(CH₂)₃−CN / 10 mol% −C(=O)−O−CH₃] | 13000 | B | A |
| Example 3 | [copolymer: 90 mol% −C(=O)−O−(CH₂)₃−CN / 10 mol% −C(=O)−O−CH₂CH₂−OH] | 32000 | A | A |
| Example 4 | [copolymer: 90 mol% −C(=O)−O−(CH₂)₃−CN / 10 mol% −C(=O)−OH] | 72000 | A | A |
| Example 5 | [polymer structure: 100 mol% repeating unit with −C(=O)−O−(CH₂)₆−CN side chain] | 17000 | B | A |

TABLE 1-continued

| | Polymer | | Evaluation | |
|---|---|---|---|---|
| | Type | Mw | Sound pressure | Flexibility |
| Example 6 | 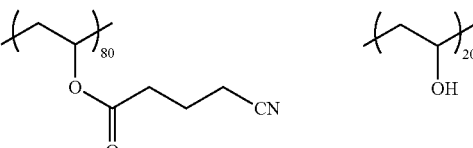 | 45000 | A | A |
| Comparative Example 1 | 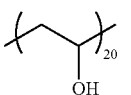 | 40000 | A | C |
| Comparative Example 2 | Cyanoethylated polyvinyl alcohol (CR-V, manufactured by Shin-Etsu Chemical Co., Ltd.) | 40000 | — | C |
| Comparative Example 3 | 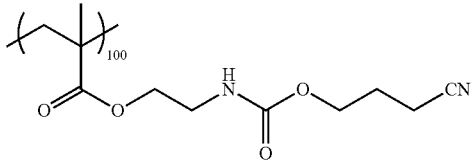 | 25000 | B | C |

As listed in Table 1, desired effects were obtained by using a predetermined polymer-based piezoelectric composite material.

Among these, based on the comparison of Examples 1 to 6, it was confirmed that a more excellent effect can be obtained in a case where the specific polymer is a polymer having only a repeating unit represented by Formula (2) in which n represents an integer of 3 to 5 or a polymer having a repeating unit represented by Formula (2) or a repeating unit containing a polar group other than a cyano group (preferably a repeating unit represented by Formula (3)).

As shown in the results described above, the effects of the present invention are apparent.

EXPLANATION OF REFERENCES

10: piezoelectric film
11a: lower electrode laminate
11b: laminate
11c: upper electrode laminate
12: piezoelectric layer
14: lower (thin film) electrode
16: upper (thin film) electrode
18: lower protective layer
20: upper protective layer
24: polymer matrix
26: piezoelectric particle
40: piezoelectric speaker
42: case
48: frame
60: organic EL display
62: organic EL display device
64, 82: substrate
68: anode
70: light emitting layer
72: cathode
74, 92: transparent substrate
78: electronic paper
80: electronic paper device
84, 106: lower electrode
86: display layer
86a: microcapsule
90, 110: upper electrode
94: liquid crystal display
96: liquid crystal display device
98: light guide plate
100: light source
102, 114: polarizer
104: lower substrate
108: liquid crystal layer
112: upper substrate
116: protective film
120: vocal cord microphone
126: piezoelectric ceramic
128: metal plate
130: cushion
132: spring
134, 136: signal line

What is claimed is:

1. A polymer-based piezoelectric composite material comprising:
a polymer matrix which contains a polymer containing a group represented by Formula (1); and
piezoelectric particles, $$*-L^1-(CR^1R^2)_n-CN \quad \text{Formula (1)}$$

in Formula (1), $L^1$ represents a divalent linking group excluding a urethane group, $R^1$ and $R^2$ each independently represent a hydrogen atom, an alkyl group, or an aryl group, n represents an integer of 3 or greater, and * represents a bonding position with respect to a main chain of a polymer.

2. The polymer-based piezoelectric composite material according to claim 1,
wherein the polymer has a repeating unit represented by Formula (2),

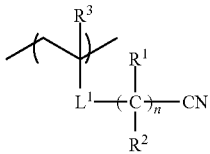 (2)

$L^1$, $R^1$, $R^2$, and n in Formula (2) each have the same definition as that for $L^1$, $R^1$, $R^2$, and n in Formula (1), and $R^3$ represents a hydrogen atom or an alkyl group.

3. The polymer-based piezoelectric composite material according to claim 2, wherein $L^1$ represents —O—, —S—, —CO—, —NH—, or a group formed by combining two or more thereof, where a urethane group is excluded.

4. The polymer-based piezoelectric composite material according to claim 2, wherein the polymer is a polymer having only a repeating unit represented by Formula (2) in which n represents an integer of 3 to 5 or a polymer having a repeating unit represented by Formula (2) and a repeating unit containing a polar group other than a cyano group.

5. The polymer-based piezoelectric composite material according to claim 1, wherein a content of the piezoelectric particles is 50% by volume or greater with respect to a total volume of the polymer-based piezoelectric composite material.

6. The polymer-based piezoelectric composite material according to claim 1, wherein the piezoelectric particles include ceramic particles having a perovskite-type or wurtzite-type crystal structure.

7. The polymer-based piezoelectric composite material according to claim 6, wherein the piezoelectric particles contain any of lead zirconate titanate, lead lanthanum zirconate titanate, barium titanate, zinc oxide, or a solid solution of barium titanate and bismuth ferrite.

8. A piezoelectric film comprising:

the polymer-based piezoelectric composite material according to claim 1; and two thin film electrodes laminated on both surfaces of the polymer-based piezoelectric composite material.

9. A piezoelectric speaker comprising:

the piezoelectric film according to claim 8.

10. A flexible display comprising:

the piezoelectric film according to claim 8 that is attached to a surface of a flexible display having flexibility on a side opposite to an image display surface.

* * * * *